(12) United States Patent (10) Patent No.: US 8,569,753 B2
Isobe et al. (45) Date of Patent: Oct. 29, 2013

(54) STORAGE DEVICE COMPRISING SEMICONDUCTOR ELEMENTS

(75) Inventors: Atsuo Isobe, Isehara (JP); Yoshinori Ieda, Atsugi (JP); Keitaro Imai, Yokohama (JP); Kiyoshi Kato, Atsugi (JP); Yuto Yakubo, Isehara (JP); Yuki Hata, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 187 days.

(21) Appl. No.: 13/117,588

(22) Filed: May 27, 2011

(65) Prior Publication Data

US 2011/0297928 A1 Dec. 8, 2011

(30) Foreign Application Priority Data

Jun. 4, 2010 (JP) ................... 2010-129278

(51) Int. Cl.
*H01L 21/02* (2006.01)
(52) U.S. Cl.
USPC ... 257/43; 257/72; 257/E21.002; 257/E21.404; 438/151; 438/763
(58) Field of Classification Search
USPC ............. 257/43, 72, E29.296, E21.002, 257/E21.404; 438/104, 151, 763
See application file for complete search history.

(56) References Cited

U.S. PATENT DOCUMENTS 4,466,081 A 8/1984 Masuoka
5,712,817 A * 1/1998 Suh .................. 365/185.08
5,731,856 A 3/1998 Kim et al.
5,744,864 A 4/1998 Cillessen et al.
6,127,702 A 10/2000 Yamazaki et al.

(Continued)

FOREIGN PATENT DOCUMENTS

CN 101529591 9/2009
EP 0 053 878 A2 6/1982

(Continued)

OTHER PUBLICATIONS

Ishii.T et al., "A Poly-Silicon TFT With a Sub-5-nm Thick Channel for Low-Power Gain Cell Memory in Mobile Applications,", IEEE Transactions on Electron Devices, Nov. 1, 2004, vol. 51, No. 11, pp. 1805-1810.

(Continued)

*Primary Examiner* — John C Ingham
(74) *Attorney, Agent, or Firm* — Eric J. Robinson; Robinson Intellectual Property Law Office, P.C.

(57) ABSTRACT

The semiconductor device is provided in which a plurality of memory cells each including a first transistor, a second transistor, and a capacitor is arranged in matrix and a wiring (also referred to as a bit line) for connecting one of the memory cells and another one of the memory cells and a source or drain region in the first transistor are electrically connected through a conductive layer and a source or drain electrode in the second transistor provided therebetween. With this structure, the number of wirings can be reduced in comparison with a structure in which the source or drain electrode in the first transistor and the source or drain electrode in the second transistor are connected to different wirings. Thus, the integration degree of a semiconductor device can be increased.

10 Claims, 13 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,696,063 B2 | 4/2010 | Tsuchiya |
| 7,732,819 B2 | 6/2010 | Akimoto et al. |
| 7,782,651 B2 | 8/2010 | Tokunaga et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0101108 A1 | 5/2008 | Tokunaga et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0142888 A1* | 6/2009 | Tsuchiya ..................... 438/151 |
| 2009/0152506 A1 | 6/2009 | Umeda et al. |
| 2009/0152541 A1 | 6/2009 | Maekawa et al. |
| 2009/0224245 A1* | 9/2009 | Umezaki ..................... 257/59 |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2010/0315868 A1 | 12/2010 | Tokunaga et al. |

FOREIGN PATENT DOCUMENTS

| | | |
|---|---|---|
| EP | 1737044 A | 12/2006 |
| EP | 2226847 A | 9/2010 |
| JP | 57-105889 | 7/1982 |
| JP | 60-198861 A | 10/1985 |
| JP | 62-274773 A | 11/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-109776 A | 5/1991 |
| JP | 05-251705 A | 9/1993 |
| JP | 08-264794 A | 10/1996 |
| JP | 09-213812 A | 8/1997 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2008-135729 A | 6/2008 |
| JP | 2009-158939 A | 7/2009 |
| KR | 2009-0085630 A | 8/2009 |
| WO | WO-2004/114391 | 12/2004 |
| WO | WO-2008/050880 | 5/2008 |

OTHER PUBLICATIONS

Kim.W et al., "An Experimental High-Density DRAM Cell with a Built-in Gain Stage,", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs ,", IEDM 92: Technical Digest of International Electron Devices Meeting, Dec. 13, 1992, pp. 1006-1008.

Shukuri.S et al., "A Semi-Static Complementary Gain Cell Technology for Sub-1 V Supply DRAM's,", IEEE Transactions on Electron Devices, Jun. 1, 1994, vol. 41, No. 6, pp. 926-931.

Fortunato.E et al., "Wide-Bandgap High-Mobility ZnO Thin-Film Transistors Produced at Room Temperature,", Appl. Phys. Lett. (Applied Physics Letters) , Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of

(56) References Cited

OTHER PUBLICATIONS

International Electron Devices Meeting, Dec. 5, 2005, pp. 1067-1069.
Ikeda.T et al., "Full-Functional System Liquid Crystal Display Using CG-Silicon Technology,", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors,", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.
Takahashi.M et al., "Theoretical Analysis of IgZo Transparent Amorphous Oxide Semiconductor,", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.
Prins.M et al., "A Ferroelectric Transparent Thin-Film Transistor,", Appl. Phys. Lett. (Applied Physics Letters), Jun. 17, 1996, vol. 68, No. 25, pp. 3650-3652.
Nakamura.M et al., "The phase relations in the $In_2O_3$—$Ga_2ZnO_4$—ZnO system at 1350° C,", Journal of Solid State Chemistry, Aug. 1, 1991, vol. 93, No. 2, pp. 298-315.
Kimizuka.N et al., "Syntheses and Single-Crystal Data of Homologous Compounds, $In_2O_3(ZnO)m$ (m = 3, 4, and 5), $InGaO_3(ZnO)_3$, and $Ga_2O_3(ZnO)m$ (m = 7, 8, 9, and 16) in the $In_2O_3$—$ZnGa_2O_4$—ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.
Asakuma.N et al., "Crystallization and Reduction of SOL-Gel-Derived Zinc Oxide Films by Irradiation With Ultraviolet Lamp,", Journal of SOL-Gel Science and Technology, 2003, vol. 26, pp. 181-184.
Osada.T et al., "15.2: Development of Driver-Integrated Panel using Amorphous In—Ga—Zn-Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters), Sep. 13, 2004, vol. 85, No. 11, pp. 1993-1995.
Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GiZO ($Ga_2O_3$—$In_2O_3$—ZnO) TFT,", SID Digest '08 : SID International Symposium Digest of Technical Papers, May 20, 2008, vol. 39, pp. 633-636.
Lee.J et al., "World's Largest (15-Inch) XGA AMLCD Panel Using IgZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing $MoO_3$ As a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid State Circuits, 2008, vol. 43, No. 1, pp. 292-299.
Ohara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn-Oxide TFTs,", IDW '09 : Proceedings of the 16th International Display Workshops, 2009, pp. 689-692.
Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by Peald Grown ZnO TFT,", IMID '07 Digest, 2007, pp. 1249-1252.
Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.
Osada.T et al., "Development of Driver-Integrated Panel Using Amorphous In—Ga—Zn-Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTs) For AMLCDs,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn-Oxide TFT,", SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTs With a Novel Passivation Layer,", SID Digest '09 : SID International Symposium Digest of Technical Papers, May 31, 2009, pp. 284-287.

(56) References Cited

OTHER PUBLICATIONS

Miyasaka.M, "SUFTLA Flexible Microelectronics on Their Way to Business,", SID Digest '07 : SID International Symposium Digest of Techical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, andYb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Revew Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", JPN. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

International Search Report (Application No. PCT/JP2011/062144) Dated Aug. 30, 2011.

Written Opinion (Application No. PCT/JP2011/062144) Dated Aug. 30, 2011.

* cited by examiner

FIG. 7A
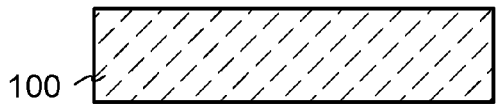
FIG. 7B
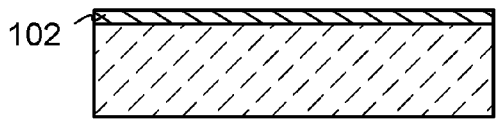
FIG. 7C
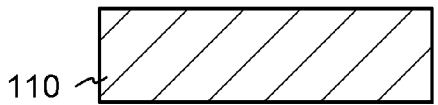
FIG. 7D
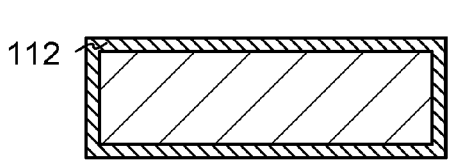
FIG. 7E
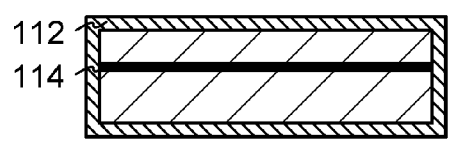
FIG. 7F
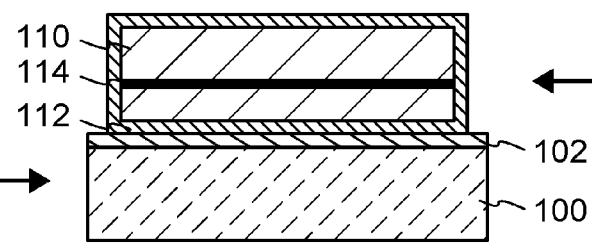
FIG. 7G
FIG. 7H
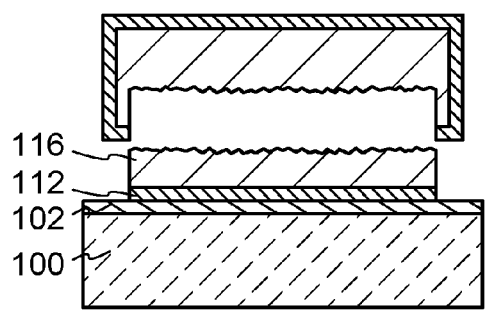
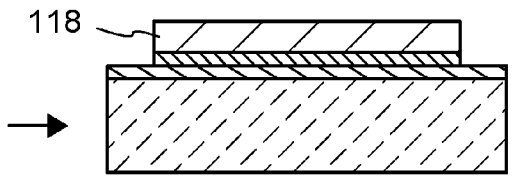

FIG. 10

| | | Writing to first row<br>1 row, 1 column, "1"<br>1 row, 2 column, "0" | Reading from first row<br>1 row, 1 column, "1"<br>1 row, 2 column, "0" |
|---|---|---|---|
| SL | V1<br>V2<br>0V | | |
| BL(1) | V1<br>V2<br>0V | | |
| BL(2) | V1<br>V2<br>0V | | |
| S(1) | V1<br>0V<br>VL | | |
| S(2) | V1<br>0V<br>VL | | |
| WL(1) | VH<br>0V<br>VL | | |
| WL(2) | VH<br>0V<br>VL | | |
| D(1) | V1<br>0V | high impedance | |
| D(2) | V1<br>0V | high impedance | |

FIG. 12

| | | Writing to first row<br>1 row, 1 column, "1"<br>1 row, 2 column, "0" | Reading from first row<br>1 row, 1 column, "1"<br>1 row, 2 column, "0" |
|---|---|---|---|
| SL | V1<br>V2<br>0V | | |
| BL(1) | V1<br>V2<br>0V | | |
| BL(2) | V1<br>V2<br>0V | | |
| S(1) | V1<br>0V<br>VL | | |
| S(2) | V1<br>0V<br>VL | | |
| WL(1) | VH<br>0V<br>VL | | |
| WL(2) | VH<br>0V<br>VL | | |
| D(1) | V1<br>0V | high impedance | |
| D(2) | V1<br>0V | high impedance | |

STORAGE DEVICE COMPRISING SEMICONDUCTOR ELEMENTS

TECHNICAL FIELD

The invention disclosed herein relates to a semiconductor device using a semiconductor element and a manufacturing method thereof.

BACKGROUND ART

Storage devices using semiconductor elements are broadly classified into two kinds of devices: a volatile device that loses stored data when power is not supplied, and a non-volatile device that holds stored data even when power is not supplied.

A typical example of a volatile storage device is a dynamic random access memory (DRAM). A DRAM stores data in such a manner that a transistor included in a storage element is selected and charge is stored in a capacitor.

When data is read from a DRAM, charge in a capacitor is lost according to the above-described principle; thus, another writing operation is necessary whenever data is read. Moreover, a transistor included in a storage element has a leakage current (off-state current) between a source and a drain in an off state or the like and charge flows into or out of a capacitor even if the transistor is not selected, whereby a data holding period is short. For that reason, another writing operation (refresh operation) is necessary at predetermined intervals, and it is difficult to sufficiently reduce power consumption. Furthermore, since stored data is lost when power is not supplied, an additional storage device using a magnetic material or an optical material is needed in order to hold data for a long time.

Another example of a volatile storage device is a static random access memory (SRAM). An SRAM holds stored data by using a circuit such as a flip-flop and thus does not need refresh operation. This means that an SRAM has an advantage over a DRAM. However, cost per storage capacity is increased because a circuit such as a flip-flop is used. Moreover, as in a DRAM, stored data in an SRAM is lost when power is not supplied.

A typical example of a non-volatile storage device is a flash memory. A flash memory includes a floating gate between a gate electrode and a channel formation region in a transistor and stores data by holding charge in the floating gate. Therefore, a flash memory has advantages in that a data holding period is extremely long (almost permanent) and refresh operation which is necessary in a volatile storage device is not needed (e.g., see Patent Document 1).

However, a gate insulating layer included in a storage element deteriorates by tunneling current generated in writing, so that the storage element stops its function after a certain number of writings. In order to reduce adverse effects of this problem, a method in which the number of writing operations for storage elements is equalized is employed, for example. However, a complicated peripheral circuit is needed to realize this method. Moreover, employing such a method does not solve the fundamental problem of lifetime. That is, a flash memory is not suitable for applications in which data is frequently rewritten.

In addition, a flash memory needs high voltage for holding charge in the floating gate or removing charge, and a circuit for generating high voltage. Further, it takes a relatively long time to hold or remove charge, and it is not easy to increase the speed of writing or erasing data.

REFERENCE

Patent Document

[Patent Document 1] Japanese Published Patent Application No. S57-105889

DISCLOSURE OF INVENTION

In view of the foregoing problems, it is an object of an embodiment of the invention disclosed herein to provide a semiconductor device with a novel structure in which stored data can be held even when power is not supplied and no matter how many times data is written.

In the disclosed invention herein, a semiconductor device is formed using a highly-purified oxide semiconductor. A transistor formed using a highly-purified oxide semiconductor can hold data for a long time because leakage current thereof is extremely small.

Specifically, structures described below can be employed, for example.

A semiconductor device according to one embodiment of the present invention includes a plurality of memory cells each including a first transistor and a second transistor. The first transistor includes a first channel formation region; a first gate insulating layer over the first channel formation region; a first gate electrode overlapping with the first channel formation region over the first gate insulating layer; and a first source region and a first drain region with the first channel formation region provided therebetween. The second transistor includes a second channel formation region; a second source electrode and a second drain electrode electrically connected to the second channel formation region; a second gate electrode overlapping with the second channel formation region; and a second gate insulating layer between the second channel formation region and the second gate electrode. The first channel formation region and the second channel formation region include different semiconductor materials. The first transistor and the second transistor overlap with each other at least partly. The first source region and the first drain region is electrically connected to a wiring for connecting one of the memory cells and another one of memory cells through a first conductive layer and the second source electrode or the second drain electrode.

In the above semiconductor device, the first conductive layer is preferably formed using the same layer as the first gate electrode.

In the above semiconductor device, the first gate electrode is preferably electrically connected to the second source electrode or the second drain electrode.

In the above semiconductor device, a capacitor preferably comprises the second source electrode or the second drain electrode, the second gate insulating layer, and the second conductive layer.

In the above semiconductor device, the second channel formation region of the second transistor preferably includes an oxide semiconductor.

Note that although the transistor is formed using an oxide semiconductor material in the above, the disclosed invention is not limited to this. A material which can realize the off-current characteristics equivalent to those of the oxide semiconductor material, such as a wide gap material like silicon carbide (more specifically, a semiconductor material with an energy gap Eg of greater than 3 eV) may be used.

Note that in this specification and the like, the term such as "over" or "below" does not necessarily mean that a component is placed "directly on" or "directly under" another component. For example, the expression "a gate electrode over a gate insulating layer" can mean the case where there is an additional component between the gate insulating layer and the gate electrode.

In addition, in this specification and the like, the term such as "electrode" or "wiring" does not limit a function of a component. For example, an "electrode" is sometimes used as part of a "wiring", and vice versa. Further, the term "electrode" or "wiring" can include the case where a plurality of "electrodes" or "wirings" is formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be used to denote the drain and the source, respectively, in this specification and the like.

Note that in this specification and the like, the term "electrically connected" includes the case where components are connected through "an object having any electric function". There is no particular limitation on "an object having any electric function" as long as electric signals can be transmitted and received between components that are connected through the object.

Examples of an "object having any electric function" are an electrode, a wiring, a switching element such as a transistor, a resistor, an inductor, a capacitor, and an element with a variety of functions.

Since the off-state current of a transistor including an oxide semiconductor is extremely low, stored data can be stored for an extremely long time by using the transistor. In other words, power consumption can be adequately reduced because refresh operation becomes unnecessary or the frequency of refresh operation can be extremely low. Moreover, stored data can be stored for a long time even when power is not supplied.

Further, a semiconductor device according to the disclosed invention does not need high voltage for writing of data, and deterioration of the element does not become a problem. For example, unlike a conventional non-volatile memory, it is not necessary to inject and extract electrons into and from a floating gate, and thus, a problem such as deterioration of a gate insulating layer does not arise at all. In other words, the semiconductor device according to the disclosed invention does not have a limit on the number of rewritings, which has been a problem in a conventional nonvolatile memory, and thus reliability thereof is drastically improved. Furthermore, since data is written by turning on or off the transistor, high-speed operation can be easily realized. In addition, there is an advantage such as no need of operation for erasing data.

Since a transistor including a material other than an oxide semiconductor can operate at sufficiently high speed, a semiconductor device can perform operation (e.g., reading data) at sufficiently high speed by using such a transistor in combination with a transistor including an oxide semiconductor. Further, a transistor including a material other than an oxide semiconductor can favorably realize a variety of circuits (such as a logic circuit or a driver circuit) which are required to operate at high speed.

Thus, a semiconductor device having a novel feature can be realized by being provided with both a transistor including a material other than an oxide semiconductor (a transistor capable of operation at sufficiently high speed, in general) and the transistor including an oxide semiconductor (a transistor whose off-state current is sufficiently low, in general).

Furthermore, in one embodiment of the disclosed invention, a wiring is shared to reduce the number of wirings, and thus a semiconductor device with an increased degree of integration can be provided.

BRIEF DESCRIPTION OF DRAWINGS

In the accompanying drawings:

FIGS. 7A to 7H are cross-sectional views showing manufacturing steps of a semiconductor substrate used for manufacturing a semiconductor device;

FIG. 10 is a timing chart;

FIG. 12 is a timing chart; and

BEST MODE FOR CARRYING OUT THE INVENTION

Figure 1A:
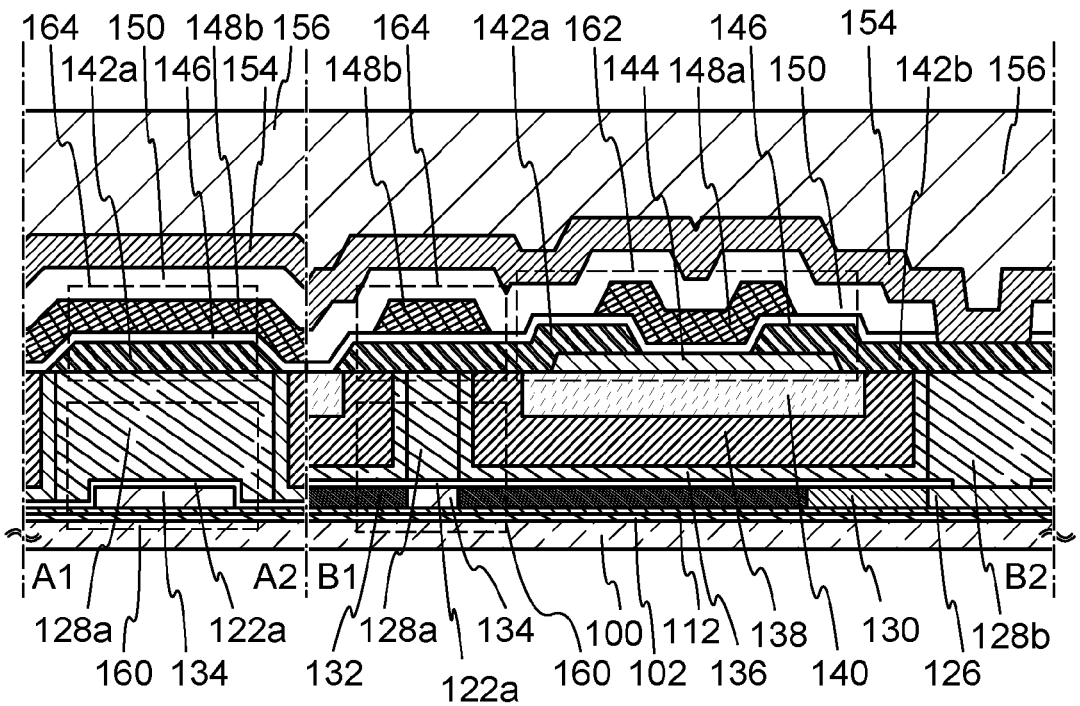
FIGS. 1A and 1B are a cross-sectional view and a planar view of a semiconductor device.

Hereinafter, embodiments of the present invention will be described with reference to the drawings. Note that the present invention is not limited to the following description and it will be easily understood by those skilled in the art that modes and details thereof can be modified in various ways without departing from the spirit and the scope of the present invention. Therefore, the present invention should not be construed as being limited to the description of the following embodiments.

Note that the position, the size, the range, or the like of each structure illustrated in the drawings and the like is not accurately represented in some cases for easy understanding. Therefore, the invention disclosed herein is not necessarily limited to the position, the size, the range, or the like disclosed in the drawings and the like.

In this specification and the like, ordinal numbers such as "first", "second", and "third" are used in order to avoid confusion among components, and the terms do not limit the components numerically.

Embodiment 1

In this embodiment, a structure and a method for manufacturing a semiconductor device according to one embodiment of the disclosed invention will be described with reference to FIGS. 1A and 1B, FIGS. 2A to 2E, FIGS. 3A to 3D, FIGS. 4A to 4D, FIGS. 5A to 5C, and FIGS. 6A and 6B.

<Cross-Sectional Structure and Planar Structure of Semiconductor Device>

Figure 1B:
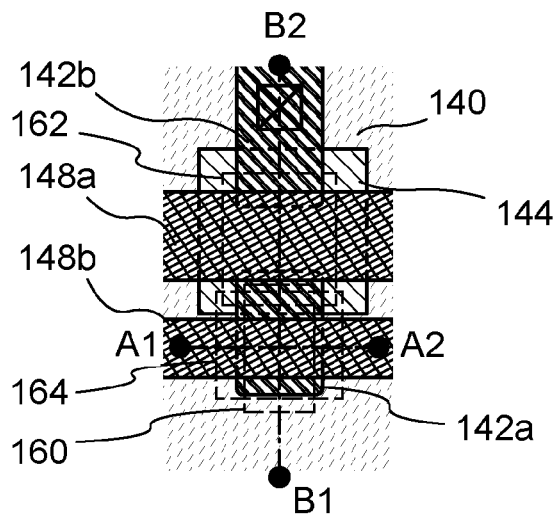

FIGS. 1A and 1B illustrate an example of the structure of the semiconductor device. FIG. 1A shows a cross section of the semiconductor device, and FIG. 1B shows a planar view of the semiconductor device. Here, FIG. 1A corresponds to a cross section along line A1-A2 and line B1-B2 in FIG. 1B. The semiconductor device illustrated in FIGS. 1A and 1B includes a transistor 160 including a first semiconductor material in a lower portion, and a transistor 162 including a second semiconductor material in an upper portion. Here, the first semiconductor material is preferably different from the second semiconductor material. For example, a semiconductor material other than an oxide semiconductor can be used as the first semiconductor material, and an oxide semiconductor can be used as the second semiconductor material. The semiconductor material other than an oxide semiconductor can be, for example, silicon, germanium, silicon germanium, silicon carbide, indium phosphide, gallium arsenide, or the like and is preferably single crystalline. Alternatively, an organic semiconductor material or the like may be used. A transistor including such a semiconductor material can operate at high speed easily. A transistor including an oxide semiconductor can hold charge for a long time because of its characteristics. The semiconductor device in FIGS. 1A and 1B can be used as a memory cell.

Either an n-channel transistor or a p-channel transistor can be used for the transistor 160 and the transistor 162. Here, the case in which the transistor 160 is a p-channel transistor and the transistor 162 is an n-channel transistor will be described. The technical feature of the disclosed invention lies in the use of a semiconductor material with which off-state current can be sufficiently reduced, such as an oxide semiconductor, in the transistor 162 in order to hold data. Therefore, it is not necessary to limit specific conditions, such as a material, a structure, and the like of the semiconductor device, to those given here.

The transistor 160 in FIGS. 1A and 1B includes a channel formation region 134 provided in a semiconductor layer over a base substrate 100, impurity regions 132 (also referred to as a source region and a drain region) with the channel formation region 134 provided therebetween, a gate insulating layer 122a provided over the channel formation region 134, and a gate electrode 128a provided over the gate insulating layer 122a so as to overlap with the channel formation region 134. Note that a transistor whose source electrode and drain electrode are not illustrated in a drawing may be referred to as a transistor for the sake of convenience. Further, in such a case, in description of a connection of such a transistor, a source electrode and a drain electrode of the transistor may be described in this specification.

Further, a conductive layer 128b is connected to an impurity region 126 provided in the semiconductor layer over the base substrate 100. Here, the conductive layer 128b functions as a source electrode or a drain electrode of the transistor 160. In addition, an impurity region 130 is provided between the impurity region 132 and the impurity region 126. Further, insulating layers 136, 138, and 140 are provided so as to surround the transistor 160. Note that in order to realize high integration, the transistor 160 preferably does not have sidewall insulating layers as illustrated in FIGS. 1A and 1B. On the other hand, when importance is put on the characteristics of the transistor 160, sidewall insulating layers may be provided on side surfaces of the gate electrode 128a, and the impurity region 132 may include regions with a different impurity concentrations.

The transistor 162 in FIGS. 1A and 1B includes an oxide semiconductor layer 144 provided over the insulating layer 140 and the like, source and drain electrodes 142a and 142b electrically connected to the oxide semiconductor layer 144, a gate insulating layer 146 covering the oxide semiconductor layer 144 and the source and drain electrodes 142a and 142b, and a gate electrode 148a provided over the gate insulating layer 146 so as to overlap with the oxide semiconductor layer 144.

Here, the oxide semiconductor layer 144 is preferably highly-purified by sufficiently removing impurities such as hydrogen or sufficiently supplying oxygen. Specifically, the hydrogen concentration of the oxide semiconductor layer 144 is $5 \times 10^{19}$ atoms/cm$^3$ or lower, preferably $5 \times 10^{18}$ atoms/cm$^3$ or lower, further preferably $5 \times 10^{17}$ atoms/cm$^3$ or lower. Note that the hydrogen concentration of the oxide semiconductor layer 144 is measured by secondary ion mass spectroscopy (SIMS). In the oxide semiconductor layer 144 which is highly purified by sufficiently reducing the hydrogen concentration therein and in which defect levels in an energy gap due to oxygen deficiency are reduced by supplying a sufficient amount of oxygen, the carrier concentration is lower than $1 \times 10^{12}$/cm$^3$, preferably lower than $1 \times 10^{11}$/cm$^3$, further preferably lower than $1.45 \times 10^{10}$/cm$^3$. For example, the off-state current (here, per unit channel width (1 μm)) at room temperature (25° C.) is lower than or equal to 100 zA (1 zA (zeptoampere) is $1 \times 10^{-21}$ A), preferably lower than or equal to 10 zA. In this manner, by using an i-type (intrinsic) or substantially i-type oxide semiconductor, the transistor 162 which has extremely favorable off-state current characteristics can be obtained.

Although the oxide semiconductor layer 144 which is processed to have an island shape is used in order to suppress leakage current generated between elements due to miniaturization in the transistor 162 of FIGS. 1A and 1B, a structure including the oxide semiconductor layer 144 which is not processed to have an island shape may be employed. In the case where the oxide semiconductor layer is not processed to have an island shape, contamination of the oxide semiconductor layer 144 due to etching in the processing can be prevented.

A capacitor 164 in FIGS. 1A and 1B includes the source or drain electrode 142a, the gate insulating layer 146, and a conductive layer 148b. That is to say, the source or drain electrode 142a functions as one of electrodes of the capacitor 164, and the conductive layer 148b functions as the other electrode of the capacitor 164. With such a structure, capacitance can be sufficiently secured. Further, in the capacitor 164, insulating properties between the source or drain electrode 142a and the conductive layer 148b can be adequately secured by stacking the oxide semiconductor layer 144 and the gate insulating layer 146. Further alternatively, the capacitor 164 may be omitted in the case where a capacitor is not needed.

Note that in the transistor 162 and the capacitor 164, end portions of the source or drain electrodes 142a and 142b are preferably tapered. The end portions of the source or drain electrodes 142a and 142b are tapered, so that coverage with the gate insulating layer 146 can be improved and disconnection can be prevented. Here, a taper angle is, for example, greater than or equal to 30° and less than or equal to 60°. Note that the taper angle means an inclination angle formed with a side surface and a bottom surface of a layer having a tapered shape (for example, the source or drain electrode 142a) when seen from a direction perpendicular to a cross section (a plane perpendicular to a surface of a substrate) of the layer.

In this embodiment, the transistor 162 and the capacitor 164 are provided so as to overlap with the transistor 160 at least partly. By employing such a planar layout, high integration can be realized. For example, given that the minimum feature size is F, the area occupied by a memory cell can be 15F$^2$ to 25F$^2$.

An insulating layer 150 is provided over the transistor 162 and the capacitor 164. A wiring 154 is provided in an opening formed in the gate insulating layer 146 and the insulating layer 150. The wiring 154 electrically connects one memory cell to another memory cell. The wiring 154 is electrically connected to the impurity region 126 through the source or drain electrode 142b and the conductive layer 128b. The above structure allows a reduction in the number of wirings in comparison with a structure in which the source region or the drain region in the transistor 160 and the source electrode or the drain electrode 142b in the transistor 162 are connected to different wirings. Thus, the integration degree of a semiconductor device can be increased.

Since the conductive layer 128b is provided, a position where the impurity region 126 and the source or drain electrode 142b are connected and a position where the source or drain electrode 142b and the wiring 154 are connected can overlap with each other. With such a planar layout, the element area can be prevented from increasing due to contact regions of the electrodes. In other words, the integration degree of the semiconductor device can be increased.

<Manufacturing Method of Semiconductor Device>

Next, an example of a method for manufacturing the semiconductor device will be described. First, a manufacturing method of the transistor 160 in the lower portion will be described below with reference to FIGS. 2A to 2E and FIGS. 3A to 3D, and then a manufacturing method of the transistor 162 and the capacitor 164 in the upper portion will be described with reference to FIGS. 4A to 4D and FIGS. 5A to 5C.

<Manufacturing Method of Transistor in Lower Portion>

A manufacturing method of the transistor 160 in the lower portion will be described with reference to FIGS. 2A to 2E and FIGS. 3A to 3D.

First, a substrate containing a semiconductor material is prepared. For the substrate containing a semiconductor material, a single crystal semiconductor substrate of silicon, carbon silicon, or the like; a microcrystalline semiconductor substrate; a compound semiconductor substrate of silicon germanium or the like; an SOI substrate, or the like can be used. For the substrate containing a semiconductor material, a single crystal semiconductor substrate of silicon or the like is preferable because high-speed reading operation of the semiconductor device can be realized.

Here, the case of using an SOI substrate in which a semiconductor layer is provided over the base substrate 100 with an insulating layer 102 and an insulating layer 112 provided therebetween for the substrate containing a semiconductor material will be described. Note that although the term "SOI substrate" generally means a substrate in which a silicon semiconductor layer is provided on an insulating surface, the term "SOI substrate" in this specification and the like also includes a substrate in which a semiconductor layer containing a material other than silicon is provided on an insulating surface. That is, a semiconductor layer included in the "SOI substrate" is not limited to a silicon semiconductor layer. Moreover, the SOI substrate can be a substrate having a structure in which a semiconductor layer is provided over an insulating substrate such as a glass substrate, with an insulating layer provided therebetween.

For the base substrate 100, a substrate made from an insulator can be used. Specific examples thereof are as follows: a variety of glass substrates used in the electronics industry, such as substrates of aluminosilicate glass, aluminoborosilicate glass, and barium borosilicate glass; a quartz substrate; a ceramic substrate; and a sapphire substrate. Further, a ceramic substrate containing silicon nitride and aluminum nitride as its main components and whose coefficient of thermal expansion is close to that of silicon may be used.

Alternatively, a semiconductor substrate such as a single crystal silicon substrate or a single crystal germanium substrate may be used for the base substrate 100. Here, for the semiconductor substrate, a solar grade silicon (SOG-Si) substrate or the like may be used. Alternatively, a polycrystalline semiconductor substrate may be used. In the case of using an SOG-Si substrate, a polycrystalline semiconductor substrate, or the like, manufacturing cost can be reduced as compared to the case of using a single crystal silicon substrate or the like.

In this embodiment, the case of using a glass substrate for the base substrate 100 is described. When a glass substrate which can have a larger size and is inexpensive is used for the base substrate 100, a cost reduction can be achieved.

The insulating layer 102 can be formed with a single layer or a stacked layer using, for example, an insulating film containing nitrogen, such as a silicon nitride ($SiN_x$) film or a silicon nitride oxide ($SiN_xO_y$ (x>y)) film. The insulating layer 102 can be formed by a CVD method, a sputtering method, or the like.

The insulating layer 112 can be formed with a single layer or a stacked layer using, for example, a silicon oxide ($SiO_x$) film or a silicon oxynitride ($SiO_xN_y$) film. The insulating layer 112 can be formed by a CVD method, a sputtering method, heat treatment (thermal oxidation treatment, thermal nitridation treatment, or the like), or the like.

Figure 2A:
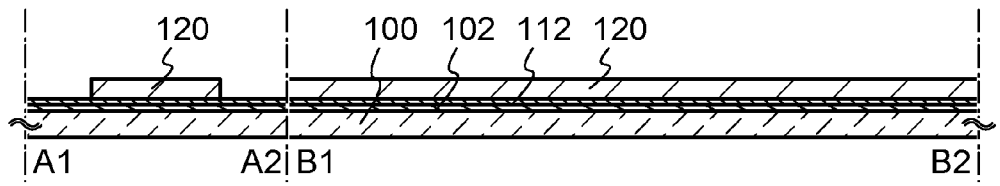
FIGS. 2A to 2E are cross-sectional views showing manufacturing steps of the semiconductor device.

The semiconductor layer is patterned to have an island shape so that a semiconductor layer 120 is formed (see FIG. 2A). Note that before or after this step, an impurity element imparting n-type conductivity or an impurity element imparting p-type conductivity may be added to the semiconductor layer in order to control the threshold voltage of the transistor. When silicon is used for the semiconductor, phosphorus, arsenic, or the like can be used as an impurity element imparting n-type conductivity. As an impurity element imparting p-type conductivity, boron, aluminum, gallium, or the like can be used.

Figure 2B:
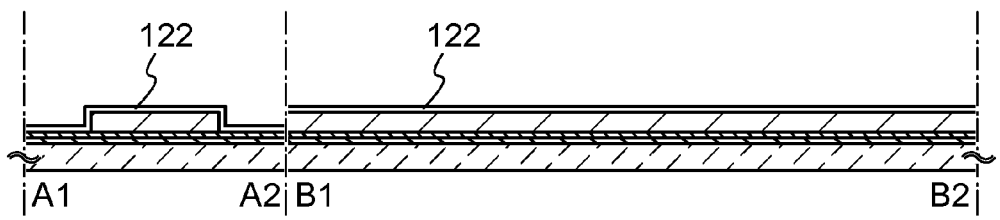

Next, an insulating layer 122 is formed so as to cover the semiconductor layer 120 (see FIG. 2B). The insulating layer 122 is to be a gate insulating layer later. The insulating layer 122 can be formed, for example, by performing heat treatment (thermal oxidation treatment, thermal nitridation treatment, or the like) on a surface of the semiconductor layer 120. Instead of heat treatment, high-density plasma treatment may be employed. The high-density plasma treatment can be performed using, for example, a mixed gas of any of a rare gas such as helium (He), argon (Ar), krypton (Kr), or xenon (Xe), oxygen, nitrogen oxide, ammonia, nitrogen, hydrogen, and the like. Alternatively, the insulating layer may be formed by a CVD method, a sputtering method, or the like. The insulating layer 122 preferably has a single-layer structure or a stacked-layer structure including any of silicon oxide, silicon oxynitride, silicon nitride, hafnium oxide, aluminum oxide, tantalum oxide, yttrium oxide, hafnium silicate ($HfSi_xO_y$ (x>0, y>0)), hafnium silicate to which nitrogen is added ($HfSi_xO_yN_z$(x>0, y>0, z>0)), hafnium aluminate to which nitrogen is added ($HfAl_xO_yN_z$(x>0, y>0, z>0)), and the like. The thickness of the insulating layer 122 may be, for example, greater than or equal to 1 nm and less than or equal to 100 nm, preferably greater than or equal to 10 nm and less than or equal to 50 nm. Here, a single-layer insulating layer containing silicon oxide is formed using a plasma CVD method.

Figure 2C:
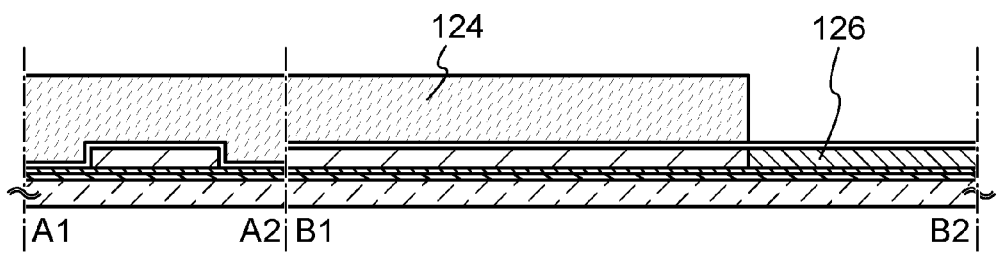

Next, a mask 124 is formed over the insulating layer 122 and an impurity element imparting one conductivity type is added to the semiconductor layer 120, so that the impurity region 126 is formed (see FIG. 2C). Here, heavy doping of boron (B) is performed under the following condition: the flow rate of a using gas of 15% $B_2H_6$ ($B_2H_6$:$H_2$=15:85 [volume ratio]) is 80 sccm, the acceleration voltage is 20 kV, the 5.0 μA, and the dosage is $5\times10^{15}$ cm$^{-2}$. Although only the case where an impurity element imparting p-type conductivity is added is described here in order to manufacture a p-channel transistor, in the case where an n-channel transistor is manufactured, an impurity element imparting n-type conductivity is added. Note that the mask 124 is removed after the impurity element is added.

Figure 2D:
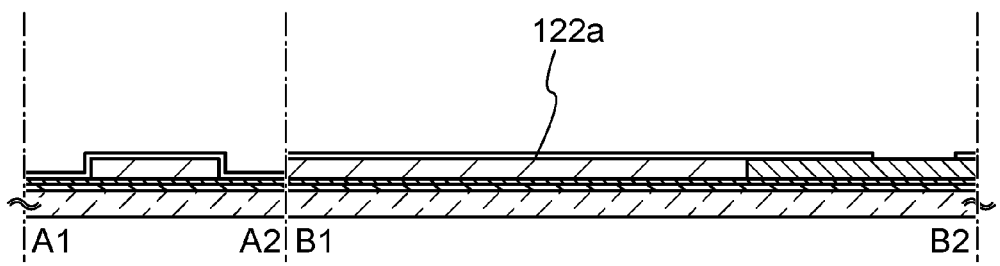

Next, a mask is formed over the insulating layer 122 and a region of the insulating layer 122 that overlaps with the impurity region 126 is partly removed, so that the gate insulating layer 122a is formed (see FIG. 2D). Part of the insulating layer 122 can be removed by etching such as wet etching or dry etching.

Figure 2E:
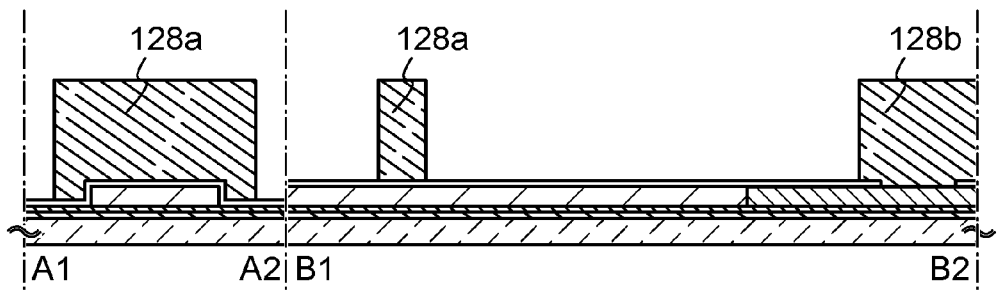

Next, a conductive layer for forming a gate electrode (including a wiring formed using the same layer as the gate electrode) is formed over the gate insulating layer 122a and is processed, so that the gate electrode 128a and the conductive layer 128b are formed (see FIG. 2E).

The conductive layer used for the gate electrode 128a and the conductive layer 128b can be formed using a metal material such as aluminum, copper, titanium, tantalum, or tungsten. The layer containing a conductive material may be formed using a semiconductor material such as polycrystalline silicon. There is no particular limitation on the method for forming the layer containing a conductive material, and a variety of film formation methods such as an evaporation method, a CVD method, a sputtering method, or a spin coating method can be used. The conductive layer may be processed by etching using a resist mask.

Figure 3A:
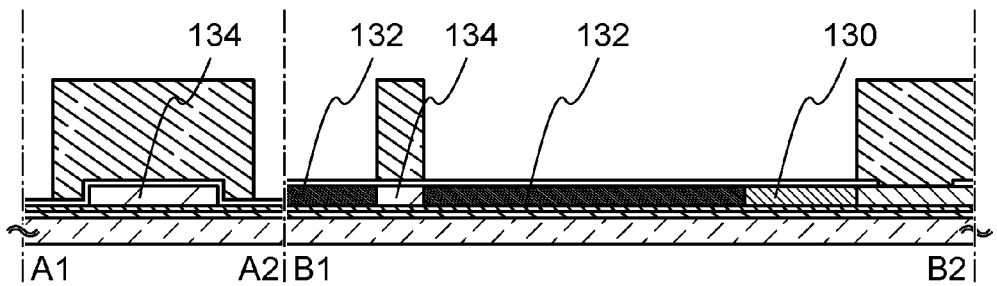
FIGS. 3A to 3D are cross-sectional views showing manufacturing steps of the semiconductor device.

Next, an impurity element imparting one conductivity type is added to the semiconductor layer with the use of the gate electrode 128a and the conductive layer 128b as masks, so that the channel formation region 134, the impurity region 132, and the impurity region 130 are formed (see FIG. 3A). Here, heavy doping of boron (B) is performed under the following condition: the flow rate of a using gas of 15% $B_2H_6$ ($B_2H_6:H_2$=15:85 [volume ratio]) is 80 sccm, the acceleration voltage is 40 kV, the 5.0 µA, and the dosage is $1.5 \times 10^{16}$ cm$^{-2}$. Although an impurity element such as boron (B) or aluminum (Al) is added here in order to manufacture a p-channel transistor, when an n-channel transistor is manufactured, an impurity element such as phosphorus (P) or arsenic (As) is added. Here, the concentration of an impurity element to be added can be set as appropriate. In addition, after the impurity element is added, heat treatment for activation is performed. Here, the concentration of the impurity element in the impurity region is increased in the following order: the impurity region 126, the impurity region 132, and the impurity region 130. Note that the descending order of concentration of the impurity element in the impurity region between the impurity region 126, the impurity region 132, and the impurity region 130 is the above order in this embodiment; however, depending on the condition of heavy doping, the descending order of the concentration of the impurity element between the impurity region 126 and the impurity region 132 might be changed.

Figure 3B:
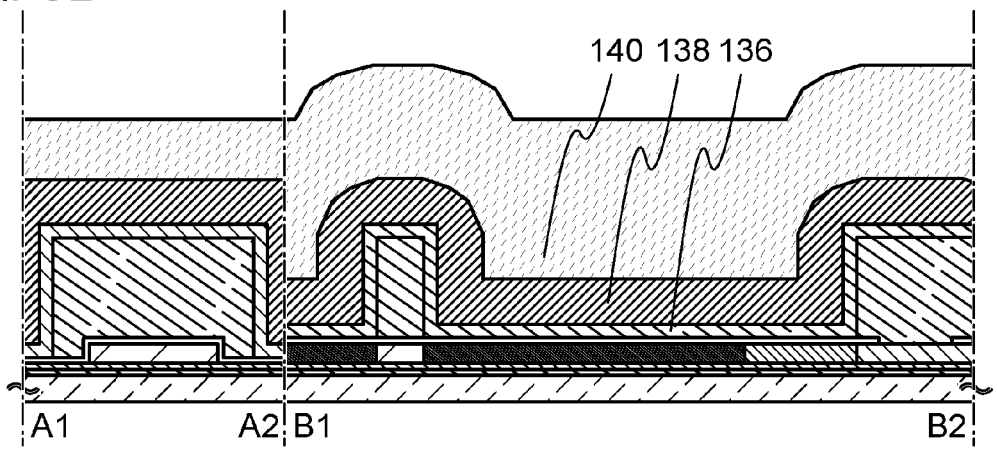

Next, the insulating layer 136, the insulating layer 138, and the insulating layer 140 are formed so as to cover the gate insulating layer 122a, the gate electrode 128a, and the conductive layer 128b (see FIG. 3B).

The insulating layer 136, the insulating layer 138, and the insulating layer 140 can be formed using a material including an inorganic insulating material such as silicon oxide, silicon oxynitride, silicon nitride oxide, silicon nitride, or aluminum oxide. The insulating layer 136, the insulating layer 138, and the insulating layer 140 are particularly preferably formed using a low dielectric constant (low-k) material, because capacitance due to overlapping electrodes or wirings can be sufficiently reduced. Note that the insulating layer 136, the insulating layer 138, and the insulating layer 140 may be porous insulating layers formed using any of these materials.

Since the porous insulating layer has a lower dielectric constant than a dense insulating layer, capacitance due to electrodes or wirings can be further reduced. Alternatively, the insulating layer 136, the insulating layer 138, and the insulating layer 140 can be formed using an organic insulating material such as polyimide or acrylic. In this embodiment, the case of using silicon oxynitride for the insulating layer 136, silicon nitride oxide for the insulating layer 138, and silicon oxide for the insulating layer 140 will be described. A stacked structure of the insulating layer 136, the insulating layer 138, and the insulating layer 140 is employed here; however, one embodiment of the disclosed invention is not limited to this. A single-layer structure, a stacked-layer structure of two layers, or a stacked-layer structure of four or more layers may also be used.

Figure 3C:
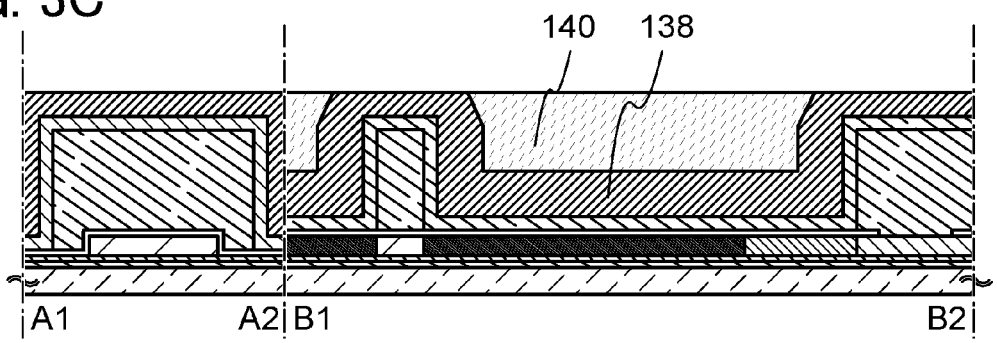

Next, the insulating layer 138 and the insulating layer 140 are subjected to chemical mechanical polishing (CMP) treatment, or etching treatment, so that the insulating layer 138 and the insulating layer 140 are flattened (see FIG. 3C). Here, CMP treatment is performed until the insulating layer 138 is partly exposed. When silicon nitride oxide is used for the insulating layer 138 and silicon oxide is used for the insulating layer 140, the insulating layer 138 functions as an etching stopper, and thus variation in the amount of polishing within the substrate surface can be suppressed.

Figure 3D:
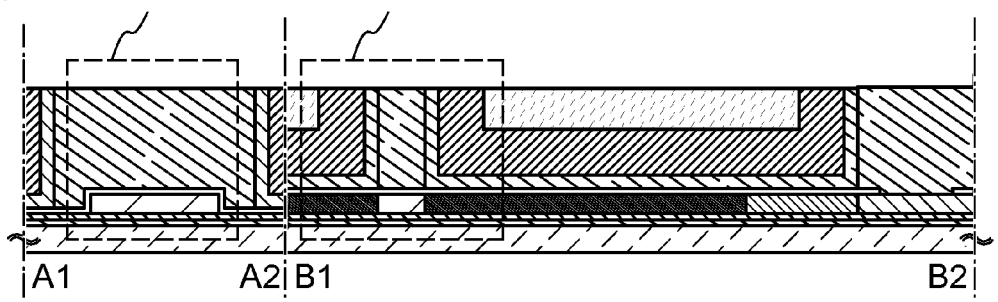

Next, the insulating layer 138 and the insulating layer 140 are subjected to CMP treatment, or etching treatment, so that upper surfaces of the gate electrode 128a and the conductive layer 128b are exposed (see FIG. 3D). Here, etching is performed until the gate electrode 128a and the conductive layer 128b are partly exposed. For the etching treatment, dry etching is preferably performed, but wet etching may be performed. In the step of partly exposing the gate electrode 128a and the conductive layer 128b, in order to improve the characteristics of the transistor 162 which is formed later, the surfaces of the insulating layer 136, the insulating layer 138, and the insulating layer 140 are preferably flattened as much as possible.

Through the above steps, the transistor 160 in the lower portion can be formed (see FIG. 3D).

Note that before or after each of the steps, a step for forming an additional electrode, wiring, semiconductor layer, insulating layer, or the like may be further performed. For example, a multilayer wiring structure in which an insulating layer and a conductive layer are stacked is employed as a wiring structure, so that a highly-integrated semiconductor device can be provided.

<Manufacturing Method of Transistor in Upper Portion>

Next, a manufacturing method of the transistor 162 in the upper portion will be described with reference to FIGS. 4A to 4D and FIGS. 5A to 5C.

Figure 4A:
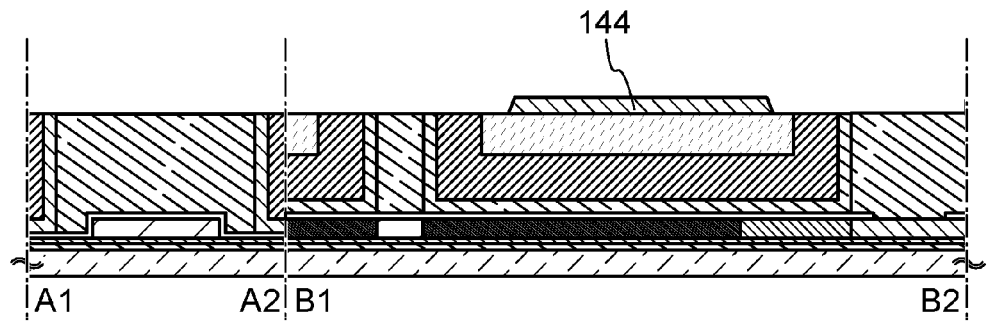
FIGS. 4A to 4D are cross-sectional views showing manufacturing steps of the semiconductor device.

First, an oxide semiconductor layer is formed over the gate electrode 128a, the conductive layer 128b, the insulating layer 136, the insulating layer 138, the insulating layer 140, and the like and is processed, so that the oxide semiconductor layer 144 is formed (see FIG. 4A). Note that an insulating layer functioning as a base may be formed over the insulating layer 136, the insulating layer 138, and the insulating layer 140 before the oxide semiconductor layer is formed. The insulating layer can be formed by a PVD method such as a sputtering method, or a CVD method such as a plasma CVD method.

The oxide semiconductor layer 144 contains at least one element selected from In, Ga, Sn, Zn, Al, Mg, Hf, and lanthanoid. For example, a four-component metal oxide such as an In—Sn—Ga—Zn—O-based oxide semiconductor, a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, a Sn—Al—Zn—O-based oxide semiconductor, In—Hf—Zn—O-based oxide semiconductor, In—La—Zn—O-based oxide semiconductor, In—Ce—Zn—O-based oxide semiconductor, In—Pr—Zn—O-based oxide semiconductor, In—Nd—Zn—O-based oxide semiconductor, In—Pm—Zn—O-based oxide semiconductor, In—Sm—Zn—O-based oxide semiconductor, In—Eu—Zn—O-based oxide semiconductor, In—Gd—Zn—O-based oxide semiconductor, In—Tb—Zn—O-based oxide semiconductor, In—Dy—Zn—O-based oxide semiconductor, In—Ho—Zn—O-based oxide semiconductor, In—Er—Zn—O-based oxide semiconductor, In—Tm—Zn—O-based oxide semiconductor, In—Yb—Zn—O-based oxide semiconductor, or In—Lu—Zn—O-based oxide semiconductor, a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor, a single-component metal oxide such as an In—O-based oxide semiconductor, a Sn—O-based oxide semiconductor, or a Zn—O-based oxide semiconductor, or the like can be used. In addition, any of the oxide semiconductors may contain an element other than In, Ga, Sn, and Zn, for example, $SiO_2$.

For example, an In—Ga—Zn—O-based oxide semiconductor means an oxide film containing indium (In), gallium (Ga), and zinc (Zn), and there is no limitation on the composition ratio thereof.

In particular, an In—Ga—Zn—O-based oxide semiconductor material has sufficiently high resistance when there is no electric field and the off-state current can be sufficiently reduced. In addition, the In—Ga—Zn—O-based oxide semiconductor material has high field-effect mobility and thus is suitable as a semiconductor material used for a semiconductor device.

As a typical example of the In—Ga—Zn—O-based oxide semiconductor material, one represented by $InGaO_3(ZnO)_m$ (m>0) is given. Using M instead of Ga, there is an oxide semiconductor material represented by $InMO_3(ZnO)_m$ (m>0). Here, M denotes one or more metal elements selected from gallium (Ga), aluminum (Al), iron (Fe), nickel (Ni), manganese (Mn), cobalt (Co), or the like. For example, M may be Ga, Ga and Al, Ga and Fe, Ga and Ni, Ga and Mn, Ga and Co, or the like. Note that the above-described compositions are derived from the crystal structures that the oxide semiconductor material can have, and are mere examples.

In the case where an In—Zn—O-based material is used as the oxide semiconductor, a target used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=15:1 to 1.5:1 ($In_2O_3$:ZnO=15:2 to 3:4 in a molar ratio). For example, in a target used for forming an In—Zn—O-based oxide semiconductor which has an atomic ratio of In:Zn:O=X:Y:Z, the relation of Z>1.5X+Y is satisfied.

The thickness of the oxide semiconductor layer is preferably greater than or equal to 3 nm and less than or equal to 30 nm. This is because the transistor might possibly be normally on when the oxide semiconductor layer is too thick (e.g., the thickness is 50 nm or more).

The oxide semiconductor layer is preferably formed by a method in which impurities such as hydrogen, water, a hydroxyl group, or hydride do not enter the oxide semiconductor layer. For example, the oxide semiconductor layer can be formed by a sputtering method or the like.

In this embodiment, the oxide semiconductor layer is formed by a sputtering method with the use of an In—Ga—Zn—O-based oxide target.

As the In—Ga—Zn—O-based oxide target, for example, an oxide target having a composition ratio of $In_2O_3$:$Ga_2O_3$:ZnO=1:1:1 [molar ratio] can be used. Note that it is not necessary to limit the material and the composition ratio of the target to the above. For example, an oxide target having a composition ratio of $In_2O_3$:$Ga_2O_3$:ZnO=1:1:2 [molar ratio] can be used.

The filling rate of the oxide target is higher than or equal to 90% and lower than or equal to 100%, preferably higher than or equal to 95% and lower than or equal to 99.9%. With the use of the metal oxide target with high fill rate, a dense oxide semiconductor layer can be formed.

The atmosphere for deposition may be a rare gas (typically argon) atmosphere, an oxygen atmosphere, a mixed atmosphere of a rare gas and oxygen, or the like. An atmosphere of a high-purity gas from which an impurity such as hydrogen, water, a hydroxyl group, or hydride is removed is preferable, in order to prevent hydrogen, water, a hydroxyl group, hydride, or the like from entering the oxide semiconductor layer.

For example, the oxide semiconductor layer can be formed as follows.

First, the substrate is held in a deposition chamber which is kept under reduced pressure, and then is heated so that the substrate temperature reaches a temperature higher than 200° C. and lower than or equal to 500° C., preferably higher than 300° C. and lower than or equal to 500° C., further preferably higher than or equal to 350° C. and lower than or equal to 450° C.

Then, a high-purity gas in which impurities such as hydrogen, water, a hydroxyl group, or hydride are sufficiently removed is introduced into the deposition chamber from which remaining moisture is being removed, and the oxide semiconductor layer is formed over the substrate with the use of the target. In order to remove moisture remaining in the deposition chamber, an entrapment vacuum pump such as a cryopump, an ion pump, or a titanium sublimation pump is preferably used as an evacuation unit. The evacuation unit may be a turbo pump provided with a cold trap. In the deposition chamber which is evacuated with the cryopump, for example, impurities such as hydrogen, water, a hydroxyl group, or hydride (preferably, also a compound containing a carbon atom) or the like are removed, whereby the concentration of impurities such as hydrogen, water, a hydroxyl group, or hydride in the oxide semiconductor layer formed in the deposition chamber can be reduced.

In the case where the substrate temperature is low (for example, 100° C. or lower) during deposition, a substance including a hydrogen atom may enter the oxide semiconductor; thus, it is preferable that the substrate be heated at a temperature in the above range. When the oxide semiconductor layer is formed with the substrate heated at the temperature, the substrate temperature is increased, so that hydrogen bonds are cut by heat and are less likely to be taken into the oxide semiconductor layer. Therefore, the oxide semiconductor layer is formed with the substrate heated at the temperature, whereby the concentration of impurities such as hydrogen, water, a hydroxyl group, or hydride in the oxide semiconductor layer can be sufficiently reduced. Moreover, damage due to sputtering can be reduced.

An example of the deposition condition is as follows: the distance between the substrate and the target is 60 mm, the pressure is 0.4 Pa, the direct-current (DC) power is 0.5 kW, the substrate temperature is 400° C., and the deposition atmosphere is an oxygen atmosphere (the flow rate of the oxygen is 100%). Note that a pulsed direct-current power source is preferable because powder substances (also referred to as particles or dust) generated in deposition can be reduced and the film thickness can be uniform.

Note that before the oxide semiconductor layer is formed by a sputtering method, powdery substances (also referred to as particles or dust) attached on a formation surface of the oxide semiconductor layer are preferably removed by reverse sputtering in which an argon gas is introduced and plasma is generated. The reverse sputtering is a method in which voltage is applied to the substrate and plasma is generated in the vicinity of the substrate to modify a surface of the substrate side. Note that instead of argon, a gas of nitrogen, helium, oxygen or the like may be used.

The oxide semiconductor layer can be processed by being etched after a mask having a desired shape is formed over the oxide semiconductor layer. The mask can be formed by a method such as photolithography. The mask may be alternatively formed by a method such as an inkjet method. Note that the etching of the oxide semiconductor layer may be dry etching or wet etching. Both of them may be combined.

After that, heat treatment (first heat treatment) may be performed on the oxide semiconductor layer 144. The heat treatment eliminates substances including hydrogen atoms in the oxide semiconductor layer 144; thus, a structure of the oxide semiconductor layer 144 can be improved and defect level in energy gap can be reduced. The heat treatment is performed under an inert gas atmosphere at higher than or equal to 250° C. and lower than or equal to 700° C., preferably higher than or equal to 450° C. and lower than or equal to 600° C. or lower than a strain point of the substrate. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is greater than or equal to 6 N (99.9999%), preferably greater than or equal to 7 N (99.99999%) (that is, the concentration of the impurities is less than or equal to 1 ppm, preferably less than or equal to 0.1 ppm).

The heat treatment can be performed in such a way that, for example, an object to be heated is introduced into an electric furnace in which a resistance heating element or the like is used and heated, under a nitrogen atmosphere at 450° C. for an hour. The oxide semiconductor layer 144 is not exposed to the air during the heat treatment so that entry of water and hydrogen can be prevented.

The impurities are reduced by the heat treatment, leading to an i-type semiconductor layer (an intrinsic semiconductor layer) or a substantially i-type semiconductor layer. Accordingly, a transistor having extremely excellent characteristics can be realized.

The heat treatment can be referred to as dehydration treatment, dehydrogenation treatment, or the like because of its advantageous effect of removing hydrogen, water, and the like. The heat treatment can be performed at the timing, for example, before the oxide semiconductor layer is processed to have an island shape, after the gate insulating film is formed, or the like. Such dehydration treatment or dehydrogenation treatment may be conducted once or plural times.

Figure 4B:
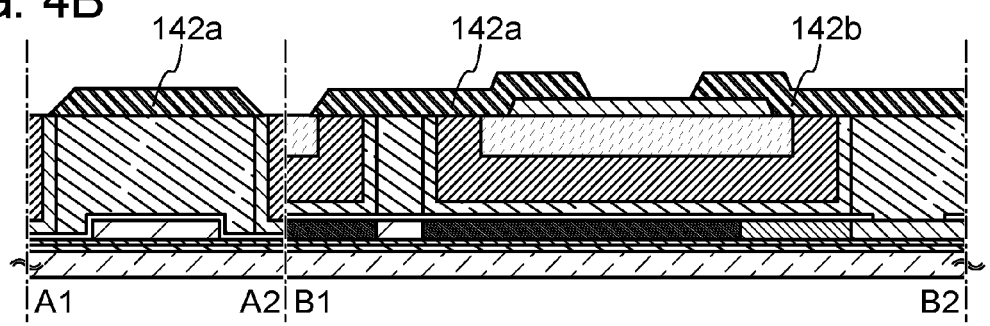

Next, a conductive layer for forming a source electrode and a drain electrode (including a wiring formed in the same layer as the source electrode and the drain electrode) is formed over the oxide semiconductor layer 144 and the like and is processed, so that the source and drain electrodes 142a and 142b are formed (see FIG. 4B).

The conductive layer can be formed by a PVD method or a CVD method. As a material for the conductive layer, an element selected from aluminum, chromium, copper, tantalum, titanium, molybdenum, and tungsten; an alloy containing any of these elements as a component; or the like can be used. A material including one of manganese, magnesium, zirconium, beryllium, neodymium, or scandium or a combination of a plurality of these elements may be used.

The conductive layer can have a single-layer structure or a layered structure including two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. Note that in the case where the conductive layer has a single-layer structure of a titanium film or a titanium nitride film, there is an advantage that the conductive layer is easily processed into the source or drain electrode 142a and the source or drain electrode 142b having tapered shapes.

Alternatively, the conductive layer may be formed using conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials containing silicon or silicon oxide can be used.

The conductive layer is preferably etched so that edge portions of the source or drain electrode 142a and the source or drain electrode 142b are tapered. Here, a taper angle is, for example, preferably greater than or equal to 30° and less than or equal to 60°. The etching is performed so that the end portions of the source or drain electrode 142a and the source or drain electrode 142b are tapered, whereby coverage with the gate insulating layer 146 formed later can be improved and disconnection can be prevented.

The channel length (L) of the transistor in the upper portion is determined by a distance between a lower edge portion of the source or drain electrode 142a and a lower edge portion of the source or drain electrode 142b. Note that for light exposure for forming a mask used in the case where a transistor with a channel length (L) of less than 25 nm is formed, it is preferable to use extreme ultraviolet rays whose wavelength is as short as several nanometers to several tens of nanometers. In the light exposure by extreme ultraviolet light, the resolution is high and the focus depth is large. For these reasons, the channel length (L) of the transistor to be formed later can be in the range of greater than or equal to 10 nm and less than or equal to 1000 nm (1 μm), and the circuit can operate at higher speed. Moreover, miniaturization can lead to low power consumption of a semiconductor device.

Figure 4C:
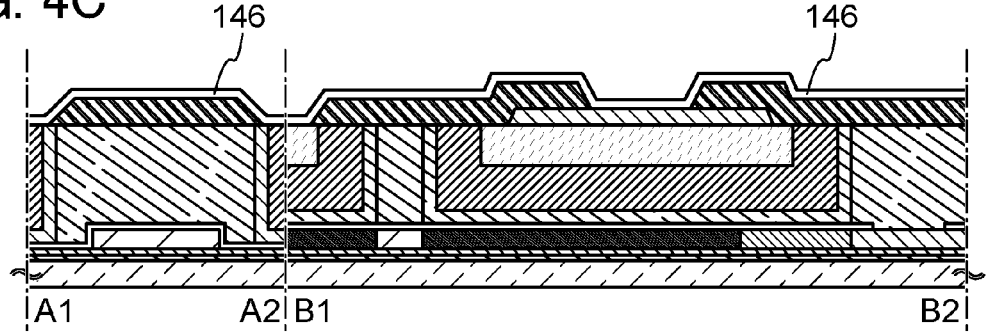

Next, the gate insulating layer 146 is formed so as to cover the source and drain electrodes 142a and 142b and to be in contact with part of the oxide semiconductor layer 144 (see FIG. 4C).

The gate insulating layer 146 can be formed by a CVD method, a sputtering method, or the like. The gate insulating layer 146 preferably includes silicon oxide, silicon nitride, silicon oxynitride, gallium oxide, aluminum oxide, tantalum oxide, hafnium oxide, yttrium oxide, hafnium silicate (Hf-Si$_x$O$_y$ (x>0, y>0)), hafnium silicate to which nitrogen is added (HfSi$_x$O$_y$N$_z$ (x>0, y>0, z>0)), hafnium aluminate to which nitrogen is added (HfAl$_x$O$_y$N$_z$ (x>0, y>0, z>0)), and the like. The gate insulating layer 146 may have a single-layer structure or a stacked-layer structure in which t these elements are combined. There is no particular limitation on the thickness; however, in the case where a semiconductor device is miniaturized, the thickness is preferably small for ensuring operation of the transistor. For example, in the case where silicon oxide is used, the thickness can be greater than or equal to 1 nm and less than or equal to 100 nm, preferably greater than or equal to 10 nm and less than or equal to 50 nm.

When the gate insulating layer is thin as described above, a problem of gate leakage due to a tunnel effect or the like is caused. In order to solve the problem of gate leakage, a high dielectric constant (high-k) material such as hafnium oxide, tantalum oxide, yttrium oxide, hafnium silicate (HfSi$_x$O$_y$ (x>0, y>0)), hafnium silicate to which nitrogen is added (Hf-Si$_x$O$_y$N$_z$ (x>0, y>0, z>0)), or hafnium aluminate to which nitrogen is added (HfAl$_x$O$_y$N$_z$ (x>0, y>0, z>0)) is preferably used for the gate insulating layer 146. By using a high-k material for the gate insulating layer 146, electrical characteristics can be ensured and the thickness can be large to prevent gate leakage. Note that a layered structure of a film containing a high-k material and a film containing any one of silicon oxide, silicon nitride, silicon oxynitride, silicon nitride oxide, aluminum oxide, and the like may be employed.

After the gate insulating layer 146 is formed, second heat treatment is desirably performed in an inert gas atmosphere or an oxygen atmosphere. The temperature of the heat treatment is higher than or equal to 200° C. and lower than or equal to 450° C., preferably higher than or equal to 250° C. and lower than or equal to 350° C. For example, the heat treatment may be performed at 250° C. for 1 hour in a nitrogen atmosphere. The second heat treatment can reduce variation in electric characteristics of the transistor. Further, in the case where the gate insulating layer 146 contains oxygen, oxygen is supplied to the oxide semiconductor layer 144 to cover oxygen deficiency in the oxide semiconductor layer 144, so that an i-type (intrinsic semiconductor) or substantially i-type oxide semiconductor layer can be formed.

Note that in this embodiment, the second heat treatment is performed after the gate insulating layer 146 is formed; the timing of the second heat treatment is not limited thereto. For example, the second heat treatment may be performed after the gate electrode is formed. Alternatively, the second heat treatment may be performed following the first heat treatment, the first heat treatment may double as the second heat treatment, or the second heat treatment may double as the first heat treatment.

As described above, at least one of the first heat treatment and the second heat treatment is employed, whereby the substances including a hydrogen atom are excluded as much as possible and the oxide semiconductor layer 144 can be highly purified.

Note that oxygen doping treatment may be performed after the oxide semiconductor layer is formed, after the oxide semiconductor layer 144 is formed, or the gate insulating layer 146 is formed. "Oxygen doping" means that oxygen (which includes at least one of an oxygen radical, an oxygen atom, and an oxygen ion) is added to a bulk. Note that the term "bulk" is used in order to clarify that oxygen is added not only to a surface of a thin film but also to the inside of the thin film. In addition, "oxygen doping" includes "oxygen plasma doping" by which oxygen that is made to be plasma is added to a bulk.

Figure 4D:
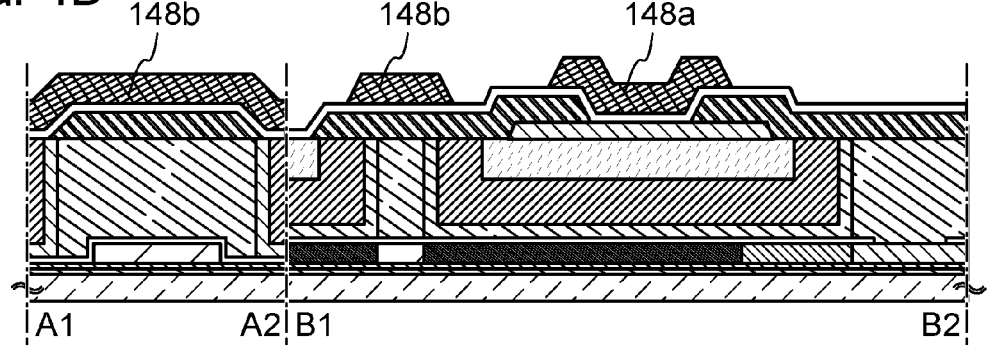

Next, a conductive layer for forming a gate electrode (including a wiring formed using the same layer as the gate electrode) is formed and is processed, so that the gate electrode 148a and the conductive layer 148b are formed (see FIG. 4D).

The oxygen doping treatment is preferably performed by an inductively coupled plasma (ICP) method, using oxygen plasma which is excited by a microwave (with a frequency of 2.45 GHz, for example).

The gate electrode 148a and the conductive layer 148b can be formed using a metal material such as molybdenum, titanium, tantalum, tungsten, aluminum, copper, neodymium, or scandium, or an alloy material containing any of these materials as a main component. Note that the gate electrode 148a and the conductive layer 148b may have a single-layer structure or a stacked-layer structure.

Figure 5A:
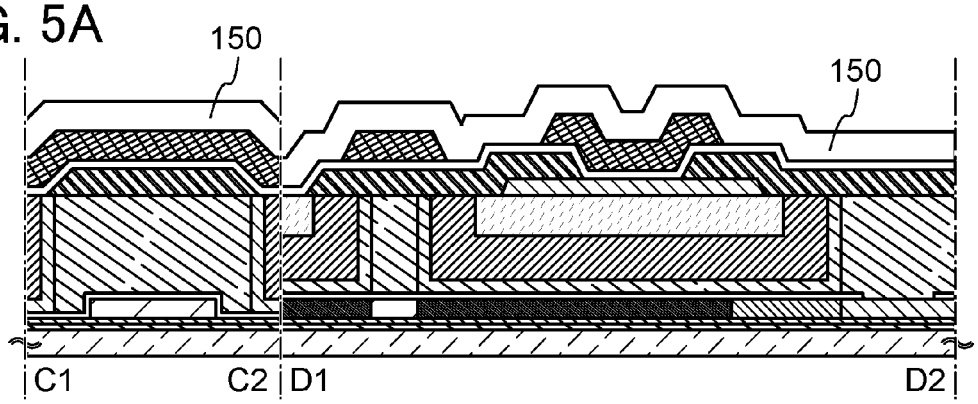
FIGS. 5A to 5C are cross-sectional views showing manufacturing steps of the semiconductor device.
Figure 5B:
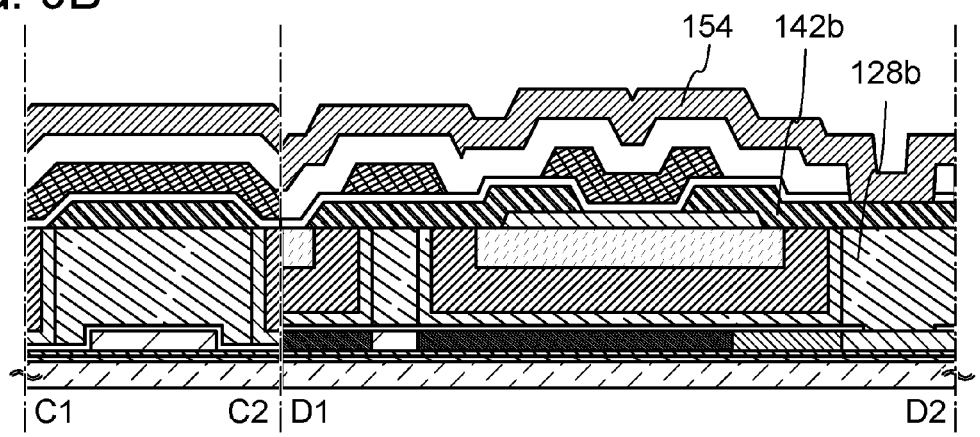

Next, the insulating layer 150 is formed over the gate insulating layer 146, the gate electrode 148a, and the conductive layer 148b (see FIG. 5A). The insulating layer 150 can be formed by a PVD method, a CVD method, or the like. The insulating layer 150 can be formed using a material including an inorganic insulating material such as a silicon oxide, a silicon oxynitride, a silicon nitride, a hafnium oxide, a gallium oxide, or an aluminum oxide. Note that for the insulating layer 150, a material with a low dielectric constant may be preferably used or a structure with a low dielectric constant (e.g., a porous structure) may be preferably employed. This is because by reducing the dielectric constant of the insulating layer 150, capacitance between wirings and electrodes can be reduced, which will increase operation speed. Note that although the insulating layer 150 has a single-layer structure in this embodiment, an embodiment of the disclosed invention is not limited to this. The insulating layer 150 may have a stacked structure including two or more layers.

Next, an opening reaching the source or drain electrode 142b is formed in the gate insulating layer 146 and the insulating layer 150. Then, the wiring 154 connected to the source or drain electrode 142b is formed over the insulating layer 150 (see FIG. 5B). The opening is formed by selective etching using a mask or the like.

A conductive layer is formed by a PVD method or a CVD method and then is patterned, so that the wiring 154 is formed. As a material for the conductive layer, an element selected from aluminum, chromium, copper, tantalum, titanium, molybdenum, and tungsten; an alloy containing any of these elements as a component; or the like can be used. A material including one of manganese, magnesium, zirconium, beryllium, neodymium, or scandium or a combination of a plurality of these elements may be used.

Specifically, it is possible to employ a method, for example, in which a thin titanium film is formed in a region including the opening of the insulating layer 150 by a PVD method and a thin titanium nitride film (about 5 nm) is formed by a PVD method, and then, an aluminum film is formed so as to be embedded in the openings. Here, the titanium film formed by a PVD method has a function of reducing an oxide film (e.g., a natural oxide film) formed on a surface over which the titanium film is formed, to decrease the contact resistance with the lower electrode or the like (here, the source or drain electrode 142b). In addition, hillock of aluminum film can be prevented. A copper film may be formed by a plating method after the formation of the barrier film of titanium, titanium nitride, or the like.

The opening formed in the insulating layer 150 is preferably formed in a region overlapping with the conductive layer 128b. With the opening in such a region, the element area can be prevented from increasing due to contact regions of the electrodes Here, the case where a position where the impurity region 126 and the source or drain electrode 142b are connected and a position where the source electrode or drain electrode 142b and the wiring 154 are connected overlap with each other without using the conductive layer 128b will be described. In this case, an opening (also referred to as a contact in a lower portion) is formed in the insulating layer 136, the insulating layer 138, and the insulating layer 140 that are formed over the impurity region 126, and the source or drain electrode 142b is formed in the contact in the lower portion. After that, an opening (also referred to as a contact in an upper portion) is formed in a region overlapping with the contact in the lower portion in the gate insulating layer 146 and the insulating layer 150, and then the wiring 154 is formed. When the contact in the upper portion is formed in the region overlapping with the contact in the lower portion, the source electrode or drain electrode 142b formed in the contact in the lower portion by etching might be disconnected. In order to avoid the disconnection, the contacts in the lower portion and in the upper portion are formed so as not to overlap with each other, so that a problem of the increase in the element area occurs.

As described in this embodiment, with the use of the conductive layer 128b, the contact in the upper portion can be formed without disconnection of the source or drain electrode 142b. Thus, the contact in the lower portion and in the upper portion can be formed overlapping with each other, so that the element area can be prevented from increasing due to contact regions of the electrodes. In other words, the integration degree of the semiconductor device can be increased.

Figure 5C:
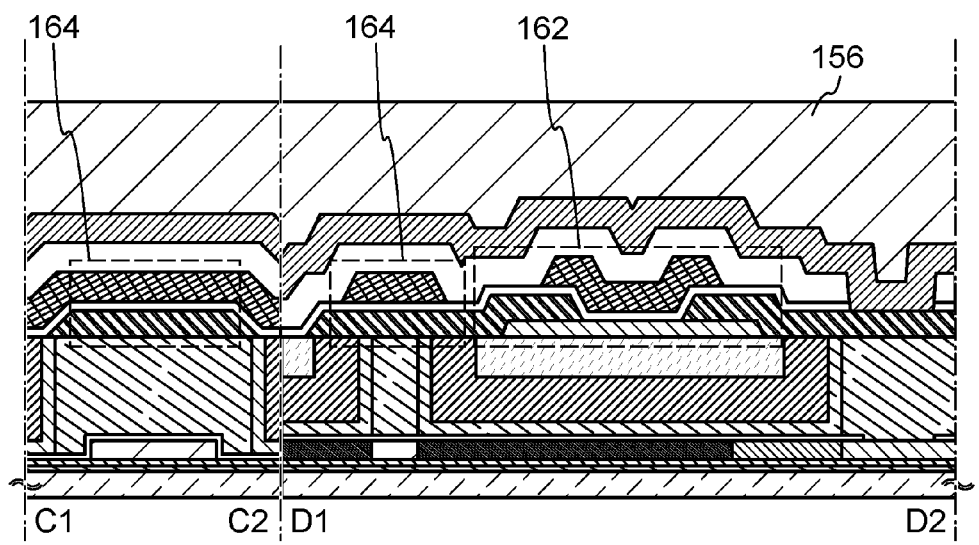

Next, the insulating layer 156 is formed so as to cover the wiring 154 (see FIG. 5C).

Through the above steps, the capacitor 164 and the transistor 162 including the highly-purified oxide semiconductor layer 144 is completed (see FIG. 5C).

Figure 6A:
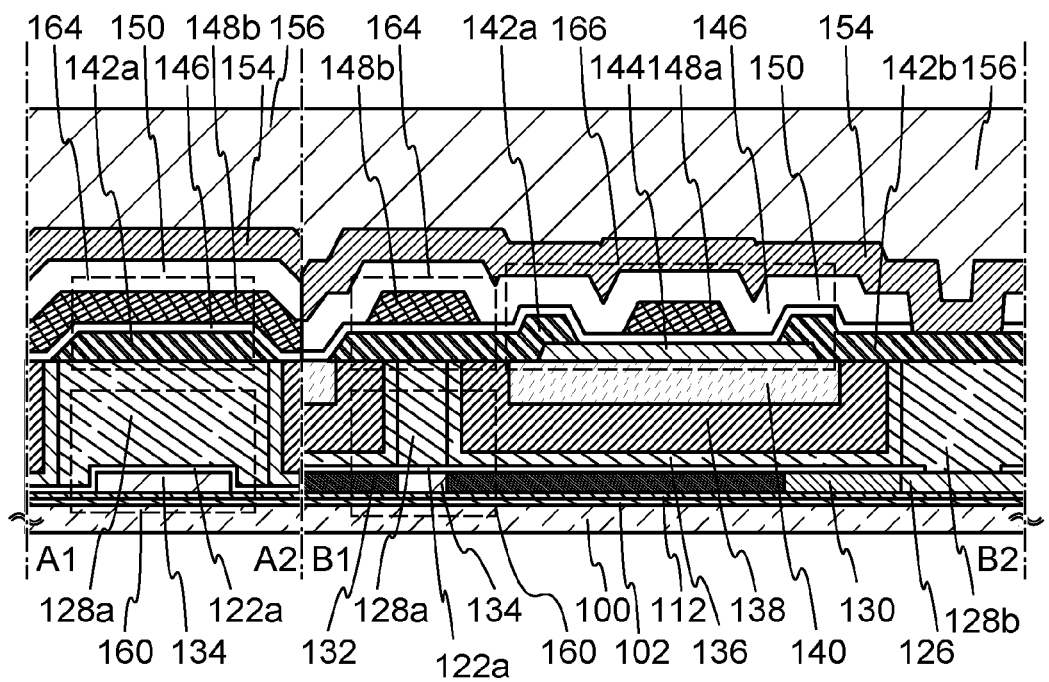
FIGS. 6A and 6B are a cross-sectional view and a planar view of a semiconductor device.
Figure 6B:
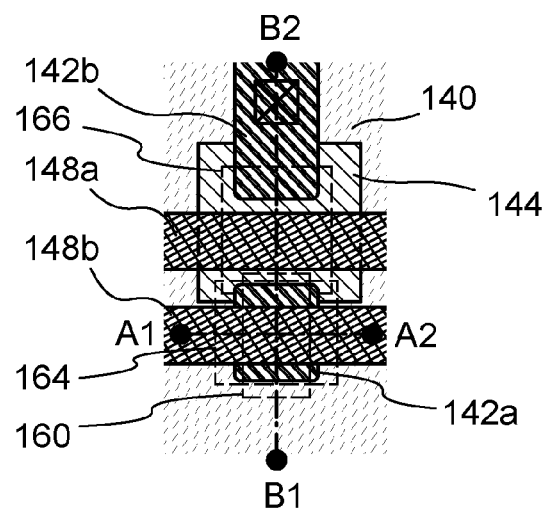

Next, a semiconductor device with a structure which is different from the structure in FIGS. 1A and 1B will be described in FIGS. 6A and 6B. FIG. 6A is a cross-sectional view of the semiconductor device, and FIG. 6B is a planar view of the semiconductor device. Here, FIG. 6A corresponds to a cross section taken along line A1-A2 and line B1-B2 in FIG. 6B.

The difference between the semiconductor device in FIGS. 1A and 1B and the semiconductor device in FIGS. 6A and 6B is the structure of the transistor using an oxide semiconductor layer. In the transistor 166 in FIGS. 6A and 6B, the oxide semiconductor layer 144 includes a channel formation region which overlaps with the gate electrode 148a and an offset region which is in contact with the channel formation region. The offset region is a region in the oxide semiconductor layer 144 that is between a region overlapping with the source and drain electrodes 142a and 142b and a region overlapping with the gate electrode 148a (the channel formation region). In other words, the offset region is a region in the oxide semiconductor layer 144 which overlaps with neither the source and drain electrodes 142a and 142b nor the gate electrode 148a. The offset region serves as a resistance region when the transistor is driven. Therefore, provision of an offset region in the oxide semiconductor layer 144 can reduce the off-state current of the transistor.

Note that it is preferable that the offset region be provided at least on the source or drain electrode 142a side. Provision of an offset region on the source or drain electrode 142a side can reduce parasitic capacitance between the gate electrode 148a of the transistor 166 and a portion (a floating gate portion) where the source or drain electrode 142a and the gate electrode 128a of the transistor 160 are electrically connected to each other. As a result, in writing operation or reading operation, the gate electrode 148a of the transistor 166 has less influence on the potential of the floating gate portion, whereby a semiconductor device capable of stable operation can be provided.

Further, an oxide semiconductor has a wide energy gap of 3.0 eV to 3.5 eV and a very small number of thermally excited carriers. Therefore, the characteristics of the transistor 166 including an oxide semiconductor do not deteriorate and an off-state current of the transistor 166 can be kept extremely low even at high temperatures. In particular, provision of the offset region in the oxide semiconductor layer 144 of the transistor 166 is effective in further reducing the off-state current of the transistor 166.

In the transistor 162 and the transistor 166 described in this embodiment, the oxide semiconductor layer 144 is purified and thus the hydrogen concentration thereof is lower than or equal to $5 \times 10^{19}$ atoms/cm$^3$, preferably lower than or equal to $5 \times 10^{18}$ atoms/cm$^3$, further preferably lower than or equal to $5 \times 10^{17}$ atoms/cm$^3$. In addition, the carrier concentration of the oxide semiconductor layer 144 is sufficiently low (e.g., lower than $1 \times 10^{12}$/cm$^3$, preferably lower than $1.45 \times 10^{10}$/cm$^3$) in comparison with that of a general silicon wafer (approximately $1 \times 10^{14}$/cm$^3$). As a result of this, a sufficiently low off-state current can be obtained. For example, the off-state current (here, per unit channel width (1 μm)) of the transistor 162 at room temperature (25° C.) is lower than or equal to 100 zA (1 zA (zeptoampere) is $1 \times 10^{-21}$ A), preferably lower than or equal to 10 zA.

With the use of the purified and intrinsic or substantially intrinsic oxide semiconductor layer 144, the off-state current of a transistor can be sufficiently reduced. Then, by using such a transistor, a semiconductor device in which stored data can be stored for an extremely long time can be obtained.

The wiring 154 is electrically connected to the impurity region 126 with the source or drain electrode 142b and the conductive layer 128b provided therebetween, so that the number of wirings can be decreased as compared to the case where the source region or the drain region in the transistor 160 and the source electrode or the drain electrode 142b in the transistor 162 are connected to different wirings. Thus, the integration degree of a semiconductor device can be increased.

Further, the conductive layer 128b is provided, so that a position where the impurity region 126 and the source or drain electrode 142b are connected and a position where the source or drain electrode 142b and the wiring 154 are connected can overlap with each other. With such a planar layout, the element area can be prevented from increasing due to contact regions of the electrodes. In other words, the integration degree of the semiconductor device can be increased.

The methods and structures described in this embodiment can be combined as appropriate with any of the methods and structures described in the other embodiments.

Embodiment 2

Next, an example of a method for manufacturing an SOI substrate used for manufacturing the above-described semiconductor device will be described with reference to FIGS. 7A to 7H.

First, the base substrate 100 is prepared (see FIG. 7A). As the base substrate 100, a substrate formed using an insulator can be used. Specific examples thereof are as follows: a variety of glass substrates used in the electronics industry, such as substrates of aluminosilicate glass, aluminoborosilicate glass, and barium borosilicate glass; a quartz substrate; a ceramic substrate; and a sapphire substrate. Further, a ceramic substrate which contains silicon nitride and aluminum oxide as its main components and whose coefficient of thermal expansion is close to that of silicon may be used.

Alternatively, a semiconductor substrate such as a single crystal silicon substrate or a single crystal germanium substrate may be used as the base substrate 100. In the case where a semiconductor substrate is used as the base substrate 100, an SOI substrate with high quality can be easily obtained because the temperature condition for heat treatment is eased as compared to the case where a glass substrate or the like is used. Here, as a semiconductor substrate, a solar grade silicon (SOG-Si) substrate or the like may be used. Alternatively, a polycrystalline semiconductor substrate may be used. In the case of using a SOG-Si substrate, a polycrystalline semiconductor substrate, or the like, manufacturing cost can be reduced as compared to the case of using a single crystal silicon substrate or the like.

Note that in this embodiment, description is given of the case where a glass substrate is used as the base substrate 100. Cost reduction can be achieved when a glass substrate which can have a larger size and is inexpensive is used as the base substrate 100.

A surface of the base substrate 100 is preferably cleaned in advance. Specifically, the base substrate 100 is subjected to ultrasonic cleaning with a hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), FPM (a mixed solution of hydrofluoric acid, hydrogen peroxide, and pure water), or the like. Through such cleaning treatment, the surface planarity of the base substrate 100 can be improved and abrasive particles left on the surface of the base substrate 100 can be removed.

Next, an insulating layer 102 (e.g., an insulating layer containing nitrogen, such as a silicon nitride ($SiN_x$) film or a silicon nitride oxide ($SiN_xO_y$ (x>y)) film) is formed over the surface of the base substrate 100 (see FIG. 7B). The insulating layer 102 can be formed by a CVD method, a sputtering method, or the like.

The insulating layer 102 formed in this embodiment corresponds to a layer for bonding a single crystal semiconductor layer (a bonding layer). The insulating layer 102 also functions as a barrier layer for preventing an impurity contained in the base substrate 100, such as sodium (Na), from diffusing into the single crystal semiconductor layer.

As described above, since the insulating layer 102 is used as the bonding layer in this embodiment, it is preferable that the insulating layer 102 be formed to have a certain level of surface planarity. Specifically, the insulating layer 102 is formed such that it has an average surface roughness ($R_a$, which is also referred to as arithmetic mean deviation) of less than or equal to 0.5 nm and a root-mean-square surface roughness (RMS) of less than or equal to 0.60 nm, preferably an average surface roughness of less than or equal to 0.35 nm and a root-mean-square surface roughness of less than or equal to 0.45 nm. Note that for the above average surface roughness or the root-mean-square surface roughness, for example, a value obtained by the measurement performed on a region of 10 μm×10 μm can be used. The thickness is set to greater than or equal to 10 nm and less than or equal to 200 nm, preferably greater than or equal to 50 nm and less than or equal to 100 nm. With the surface planarity improved as described above, the bonding defect of the single crystal semiconductor layer can be prevented.

Next, a bond substrate is prepared. Here, a single crystal semiconductor substrate 110 is used as the bond substrate (see FIG. 7C). Note that although a substrate whose crystallinity is single crystal is used as the bond substrate here, the crystallinity of the bond substrate is not necessarily limited to single crystal.

For example, as the single crystal semiconductor substrate 110, a single crystal semiconductor substrate formed using an element of Group 14, such as a single crystal silicon substrate, a single crystal germanium substrate, or a single crystal silicon germanium substrate, can be used. Further, a compound semiconductor substrate using gallium arsenide, indium phosphide, or the like can be used. Typical examples of commercially available silicon substrates are circular silicon substrates which are 5 inches (125 mm) in diameter, 6 inches (150 mm) in diameter, 8 inches (200 mm) in diameter, 12 inches (300 mm) in diameter, and 16 inches (400 mm) in diameter. Note that the shape of the single crystal semiconductor substrate 110 is not limited to circular, and the single crystal semiconductor substrate 110 may be a substrate which has been processed into, for example, a rectangular shape or the like. Further, the single crystal semiconductor substrate 110 can be formed by a Czochralski (CZ) method or a Floating Zone (FZ) method.

An insulating layer 112 is formed on a surface of the single crystal semiconductor substrate 110 (see FIG. 7D). In view of removal of contamination, it is preferable that the surface of the single crystal semiconductor substrate 110 be cleaned with a hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), FPM (a mixed solution of hydrofluoric acid, hydrogen peroxide, and pure water), or the like before the formation of the insulating layer 112. Dilute hydrofluoric acid and ozone water may be discharged alternately for cleaning.

The insulating layer 112 can be formed with, for example, a single layer structure or a layered structure of one or more of a silicon oxide film, a silicon oxynitride film, and the like. As a method for forming the insulating layer 112, a thermal treatment (thermal oxidation treatment, thermal nitridation treatment, or the like), a CVD method, a sputtering method, or the like can be used. When the insulating layer 112 is formed by a CVD method, a silicon oxide film is preferably formed using organosilane such as tetraethoxysilane (abbreviation: TEOS) (chemical formula: $Si(OC_2H_5)_4$), so that favorable bonding can be achieved.

In this embodiment, the insulating layer 112 (here, a $SiO_x$ film) is formed by performing thermal oxidation treatment on the single crystal semiconductor substrate 110. The thermal oxidation treatment is preferably performed in an oxidizing atmosphere to which halogen is added.

For example, thermal oxidation treatment of the single crystal semiconductor substrate 110 is performed in an oxidizing atmosphere to which chlorine (Cl) is added, whereby the insulating layer 112 obtained by chlorine oxidation can be formed. In this case, the insulating layer 112 is a film containing chlorine atoms. By such chlorine oxidation, heavy metal (e.g., Fe, Cr, Ni, or Mo) that is an extrinsic impurity is trapped and chloride of the metal is formed and then removed to the outside; thus, contamination of the single crystal semiconductor substrate 110 can be reduced. Moreover, after the bonding to the base substrate 100, an impurity from the base substrate, such as Na, can be fixed, so that contamination of the single crystal semiconductor substrate 110 can be prevented.

Note that the halogen atoms contained in the insulating layer 112 are not limited to chlorine atoms. A fluorine atom may be contained in the insulating layer 112. As a method for fluorine oxidation of the surface of the single crystal semiconductor substrate 110, a method in which the single crystal semiconductor substrate 110 is soaked in an HF solution and then subjected to thermal oxidation treatment in an oxidizing atmosphere, a method in which thermal oxidation treatment is performed in an oxidizing atmosphere to which $NF_3$ is added, or the like can be used.

Next, ions are accelerated by an electric field and the single crystal semiconductor substrate 110 is irradiated with the ions, and the ions are added to the single crystal semiconductor substrate 110, whereby an embrittled region 114 where the crystal structure is damaged is formed in the single crystal semiconductor substrate 110 at a predetermined depth (see FIG. 7E).

The depth at which the embrittled region 114 is formed can be adjusted by the kinetic energy, mass, charge, or incidence angle of the ions, or the like. The embrittled region 114 is formed at approximately the same depth as the average penetration depth of the ions. Therefore, the thickness of the single crystal semiconductor layer to be separated from the single crystal semiconductor substrate 110 can be adjusted with the depth at which the ions are added. For example, the average penetration depth may be adjusted such that the thickness of the single crystal semiconductor layer is approximately greater than or equal to 10 nm and less than or equal to 500 nm, preferably greater than or equal to 50 nm and less than or equal to 200 nm.

The above ion irradiation treatment can be performed with an ion-doping apparatus or an ion-implantation apparatus. As a typical example of the ion-doping apparatus, there is a non-mass-separation type apparatus in which plasma excitation of a process gas is performed and an object to be processed is irradiated with all kinds of ion species generated. In this apparatus, the object to be processed is irradiated with ion species of plasma without mass separation. In contrast, an ion implantation apparatus is a mass-separation type apparatus. In the ion-implantation apparatus, mass separation of ion species of plasma is performed and the object to be processed is irradiated with ion species having predetermined masses.

In this embodiment, an example is described in which an ion doping apparatus is used to add hydrogen to the single crystal semiconductor substrate 110. A gas containing hydrogen is used as a source gas. As for ions used for the irradiation, the proportion of $H_3^+$ is preferably set high. Specifically, it is preferable that the proportion of $H_3^+$ be set to greater than or equal to 50% (more preferably, greater than or equal to 80%) with respect to the total amount of $H^+$, $H_2^+$, and $H_3^+$. With a high proportion of $H_3^+$, the efficiency of ion irradiation can be improved.

Note that ions to be added are not limited to ions of hydrogen. Ions of helium or the like may be added. Further, ions to be added are not limited to one kind of ions, and plural kinds of ions may be added. For example, in the case of performing irradiation with hydrogen and helium concurrently using an ion-doping apparatus, the number of steps can be reduced as compared to the case of performing irradiation with hydrogen and helium in different steps, and surface roughness of the single crystal semiconductor layer to be formed later can be suppressed.

Note that heavy metal may also be added when the embrittled region 114 is formed with the ion doping apparatus; however, when the ion irradiation is performed through the insulating layer 112 containing halogen atoms, contamination of the single crystal semiconductor substrate 110 due to the heavy metal can be prevented.

Then, the base substrate 100 and the single crystal semiconductor substrate 110 are disposed to face each other, and the surface of the insulating layer 102 and the insulating layer 112 are disposed in close contact with each other. Thus, the base substrate 100 and the single crystal semiconductor substrate 110 can be bonded to each other (see FIG. 7F).

When bonding is performed, it is preferable that a pressure of greater than or equal to 0.001 $N/cm^2$ and less than or equal to 100 $N/cm^2$, e.g., a pressure of greater than or equal to 1 $N/cm^2$ and less than or equal to 20 $N/cm^2$, be applied to one part of the base substrate 100 or one part of the single crystal semiconductor substrate 110. When the bonding surfaces are made close to each other and disposed in close contact with each other by applying a pressure, a bonding between the insulating layer 102 and the insulating layer 112 is generated at the part where the close contact is made, and from that part, the bonding spontaneously spreads to almost the entire area. This bonding is performed under the action of the Van der Waals force or hydrogen bonding and can be performed at room temperature.

Note that before the single crystal semiconductor substrate 110 and the base substrate 100 are bonded to each other, surfaces to be bonded to each other are preferably subjected to surface treatment. Surface treatment can improve the bonding strength at the interface between the single crystal semiconductor substrate 110 and the base substrate 100.

As the surface treatment, wet treatment, dry treatment, or a combination of wet treatment and dry treatment can be used. Alternatively, wet treatment may be used in combination with different wet treatment or dry treatment may be used in combination with different dry treatment.

Note that heat treatment for increasing the bonding strength may be performed after bonding. This heat treatment is performed at a temperature at which separation at the embrittled region 114 does not occur (for example, a temperature of higher than or equal to room temperature and lower than 400° C.). Alternatively, bonding of the insulating layer 102 and the insulating layer 112 may be performed while heating them at a temperature in this range. The heat treatment can be performed using a diffusion furnace, a heating furnace such as a resistance heating furnace, a rapid thermal annealing (RTA) apparatus, a microwave heating apparatus, or the like. The above temperature condition is merely an example, and an embodiment of the invention disclosed herein should not be construed as being limited to this example.

Next, heat treatment is performed for separation of the single crystal semiconductor substrate 110 at the embrittled region 114, whereby a single crystal semiconductor layer 116 is formed over the base substrate 100 with the insulating layer 102 and the insulating layer 112 interposed therebetween (see FIG. 7G).

Note that the temperature for the heat treatment in the separation is desirably as low as possible. This is because as the temperature in the separation is low, generation of roughness on the surface of the single crystal semiconductor layer 116 can be suppressed. Specifically, the temperature of the heat treatment in the separation may be higher than or equal to 300° C. and lower than or equal to 600° C., and the heat treatment is more effective when the temperature is lower than or equal to 500° C. (higher than or equal to 400° C.).

Note that after the single crystal semiconductor substrate 110 is separated, the single crystal semiconductor layer 116 may be subjected to heat treatment at higher than or equal to 500° C. so that the concentration of hydrogen remaining in the single crystal semiconductor layer 116 may be reduced.

Then, the surface of the single crystal semiconductor layer 116 is irradiated with laser light, whereby a single crystal semiconductor layer 118 in which the planarity of the surface is improved and the number of defects is reduced is formed (see FIG. 7H). Note that instead of the laser light irradiation treatment, heat treatment may be performed.

Although the irradiation treatment with the laser light is performed immediately after the heat treatment for separation of the single crystal semiconductor layer 116 in this embodiment, an embodiment of the present invention is not construed as being limited to this. Etching treatment may be performed after the heat treatment for separation of the single crystal semiconductor layer 116, to remove a region where there are many defects on the surface of the single crystal semiconductor layer 116, and then the laser light irradiation treatment may be performed. Alternatively, after the surface planarity of the single crystal semiconductor layer 116 is improved, the laser light irradiation treatment may be performed. Note that the etching treatment may be either wet etching or dry etching. Further, in this embodiment, a step of reducing the thickness of the single crystal semiconductor layer 116 may be performed after the laser light irradiation. In order to reduce the thickness of the single crystal semiconductor layer 116, one of or both dry etching and wet etching may be employed.

Through the above steps, an SOI substrate including the single crystal semiconductor layer 118 with favorable characteristics can be obtained (see FIG. 7H).

Such an SOI substrate is used for a substrate containing a semiconductor material described in Embodiment 1, so that a semiconductor device can be operated at high speed.

The methods and structures described in this embodiment can be combined as appropriate with any of the methods and structures described in the other embodiments.

Embodiment 3

In this embodiment, a circuit configuration and operation of a semiconductor device according to an embodiment of the invention disclosed herein will be described with reference to FIGS. 8A-1, 8A-2, and 8B. Note that in each of the circuit diagrams, "OS" may be written beside a transistor in order to indicate that the transistor includes an oxide semiconductor.

Figure 8A:
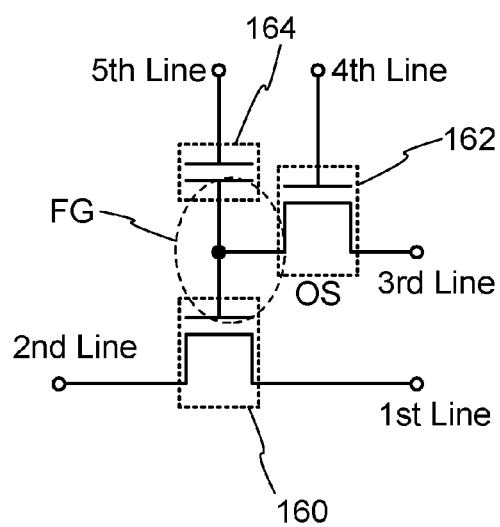
FIGS. 8A, 8B, and 8C are circuit diagrams of semiconductor devices.

In the semiconductor device illustrated in FIG. 8A, a first wiring (a 1st line) and a source electrode of a transistor 160 are electrically connected to each other. A second wiring (a 2nd line) and a drain electrode of the transistor 160 are electrically connected to each other. A third wiring (a 3rd line) and a source electrode (or a drain electrode) of a transistor 162 are electrically connected to each other, and a fourth wiring (a 4th line) and a gate electrode of the transistor 162 are electrically connected to each other. A gate electrode of the transistor 160 and the drain electrode (or the source electrode) of the transistor 162 are electrically connected to one electrode of a capacitor 164, and a fifth wiring (a 5th line) and the other electrode of the capacitor 164 are electrically connected to each other.

Here, the above transistor including an oxide semiconductor is used as the transistor 162, for example. The transistor including an oxide semiconductor has a characteristic of a significantly small off-state current. For that reason, a potential of the gate electrode of the transistor 160 can be held for an extremely long time by turning off the transistor 162. Provision of the capacitor 164 facilitates holding of charge given to the gate electrode of the transistor 160 and reading of stored data.

Note that there is no particular limitation on the transistor 160. In terms of increasing the speed of reading data, it is preferable to use, for example, a transistor with high switching rate such as a transistor including single crystal silicon.

Figure 8B:
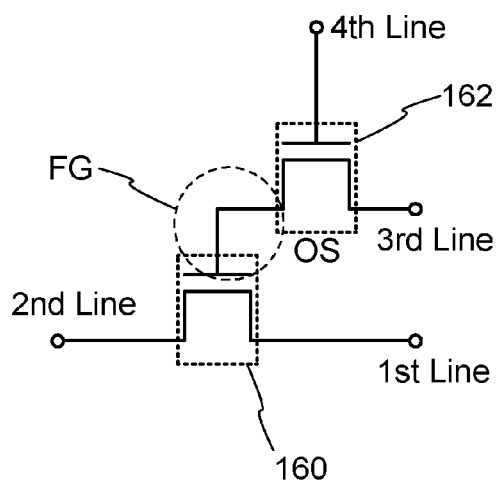

In addition, a structure in which the capacitor 164 is not provided as illustrated in FIG. 8B can be employed.

The semiconductor device in FIG. 8A can write, hold, and read data as described below, utilizing a characteristic in which the potential of the gate electrode of the transistor 160 can be held.

First of all, writing and holding of data will be described. First, the potential of the fourth wiring is set to a potential at which the transistor 162 is turned on, so that the transistor 162 is turned on. Accordingly, the potential of the third wiring is supplied to the gate electrode of the transistor 160 and the capacitor 164. That is, predetermined charge is given to the gate electrode of the transistor 160 (writing). Here, any of charges for applying two different levels of potentials (hereinafter, charge for applying a low potential is referred to as charge $Q_L$ and charge for applying a high potential is referred to as charge $Q_H$) is applied. Note that charges for applying three or more different levels of potentials may be applied to improve storage capacity. After that, the potential of the fourth wiring is set to a potential at which the transistor 162 is turned off, so that the transistor 162 is turned off. Thus, the charge given to the gate electrode of the transistor 160 is held (holding).

Since the off-state current of the transistor 162 is significantly small, the charge of the gate electrode of the transistor 160 is held for a long time.

Next, reading of data will be described. By supplying an appropriate potential (reading potential) to the fifth wiring while a predetermined potential (constant potential) is supplied to the first wiring, the potential of the second wiring varies depending on the amount of charge held in the gate electrode of the transistor 160. This is because in general, when the transistor 160 is an n-channel transistor, an apparent threshold voltage $V_{th\_H}$ in the case where $Q_H$ is given to the gate electrode of the transistor 160 is lower than an apparent threshold voltage $V_{th\_L}$ in the case where $Q_L$ is given to the gate electrode of the transistor 160. Here, an apparent threshold voltage refers to the potential of the fifth wiring, which is needed to turn on the transistor 160. Thus, by setting the potential of the fifth wiring to a potential $V_0$ which is between $V_{th\_H}$ and $V_{th\_L}$, charge applied to the gate electrode of the transistor 160 can be determined. For example, in the case where $Q_H$ is given in writing, when the potential of the fifth wiring is set to $V_0$ ($>V_{th\_H}$), the transistor 160 is turned on. In the case where $Q_L$ is given in writing, even when the potential of the fifth wiring is set to $V_0$ ($<V_{th\_L}$), the transistor 160 remains in an off state. Therefore, the held data can be read on the basis of the potential of the second wiring.

Note that in the case where memory cells are arrayed to be used, only data of desired memory cells is needed to be read. When data of a predetermined memory cell is read and data of the other memory cells is not read, in the case where the transistors 160 are connected in parallel among the memory cells, fifth wirings in memory cells that are not a target for reading are supplied with a potential at which the transistors 160 are turned off regardless of the state of the gate electrodes, that is, a potential lower than $V_{th\_H}$. In the case where the transistors 160 are connected in series between the memory cells, potential that allows the transistor 160 to be turned on regardless of the state of the gate electrode, that is, potential higher than $V_{th\_L}$ may be supplied to the fifth lines.

Then, rewriting of data will be described. Rewriting of data is performed in a manner similar to that of the writing and holding of data. That is, the potential of the fourth wiring is set to a potential at which the transistor 162 is turned on, so that the transistor 162 is turned on. Accordingly, the potential of the third wiring (potential related to new data) is supplied to the gate electrode of the transistor 160 and the capacitor 164. After that, the potential of the fourth wiring is set to a potential at which the transistor 162 is turned off, so that the transistor 162 is turned off. In this manner, charge related to new data is given to the gate electrode of the transistor 160.

In the semiconductor device according to the invention disclosed herein, data can be directly rewritten by another writing of data as described above. Therefore, extracting of charge from a floating gate with the use of a high voltage needed in a flash memory or the like is not necessary, and thus, reduction in operation speed, which is attributed to erasing operation, can be suppressed. In other words, high-speed operation of the semiconductor device can be realized.

Note that the source electrode (or the drain electrode) of the transistor 162 is electrically connected to the gate electrode of the transistor 160, thereby having an effect similar to that of a floating gate of a floating gate transistor used for a non-volatile memory element. Therefore, a portion in the drawing where the source electrode (or the drain electrode) of the transistor 162 is electrically connected to the gate electrode of the transistor 160 is called a floating gate portion FG in some cases. When the transistor 162 is off, the floating gate portion FG can be regarded as being embedded in an insulator and thus charge is held in the floating gate portion FG. The amount of off-state current of the transistor 162 including an oxide semiconductor is less than or equal to one hundred thousandth of the amount of the off-state current of a transistor including a silicon semiconductor; thus, loss of the charge accumulated in the floating gate portion FG due to a leakage current of the transistor 162 is negligible. That is, with the transistor 162 including an oxide semiconductor, a non-volatile storage device which can hold data even when power is not supplied can be realized.

For example, when the off-state current of the transistor 162 is less than or equal to 10 zA (1 zA (zeptoampere) is $1 \times 10^{-21}$ A) at room temperature (25° C.) and the capacitance value of the capacitor 164 is approximately 10 fF, data can be held for at least longer than or equal to $10^4$ seconds. It is needless to say that the holding time depends on transistor characteristics and the capacitance value.

Further, in that case, the problem of deterioration of a gate insulating film (tunnel insulating film), which has been pointed out in a conventional floating gate transistor, does not exist. That is, the deterioration of a gate insulating film due to injection of an electron into a floating gate, which has been traditionally regarded as a problem, can be solved. This means that there is no limit on the number of times of writings in principle. Furthermore, a high voltage needed for writing or erasing in a conventional floating gate transistor is not necessary.

Figure 8C:
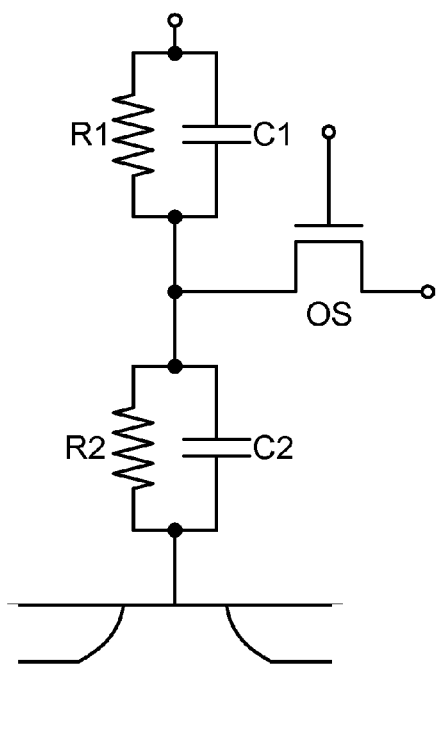

Components such as the transistors in the semiconductor device in FIG. 8A can be regarded as including resistors and capacitors as illustrated in FIG. 8C. That is, in FIG. 8C, the transistor 160 and the capacitor 164 are each regarded as including a resistor and a capacitor. R1 and C1 denote the resistance value and the capacitance value of the capacitor 164, respectively. The resistance value R1 corresponds to the resistance value which depends on an insulating layer included in the capacitor 164. R2 and C2 denote the resistance value and the capacitance value of the transistor 160, respectively. The resistance value R2 corresponds to the resistance value which depends on a gate insulating layer at the time when the transistor 160 is on. The capacitance value C2 corresponds to the capacitance value of so-called gate capacitance (capacitance formed between a gate electrode and the source electrode or the drain electrode and capacitance formed between the gate electrode and a channel formation region).

A charge holding period (also referred to as a data holding period) is determined mainly by an off-state current of the transistor 162 under the conditions that gate leakage of the transistor 162 is sufficiently small and that R1≥ROS (R1 is greater than or equal to ROS) and R2≥ROS (R2 is greater than or equal to ROS) are satisfied, where the resistance value (also referred to as effective resistance) between the source electrode and the drain electrode in the case where the transistor 162 is off is ROS.

On the other hand, when the conditions are not met, it is difficult to sufficiently secure the holding period even if the off-state current of the transistor 162 is small enough. This is because leakage current other than the off-state current of the transistor 162 (e.g., leakage current generated between the source electrode and the gate electrode) is large. Thus, it can be said that the semiconductor device disclosed in this embodiment desirably satisfies the above relation.

It is desirable that C1≥C2 (C1 is greater than or equal to C2) be satisfied. This is because when C1 is large, the potential of the fifth wiring can be supplied to the floating gate portion FG efficiently at the time of controlling the potential of the floating gate portion FG by the fifth wiring, and a difference between potentials (e.g., the reading potential and a non-reading potential) supplied to the fifth wiring can be kept low.

When the above relation is satisfied, a more preferable semiconductor device can be realized. Note that R1 and R2 depend on the gate insulating layer of the transistor 160 and the insulating layer of the capacitor 164. The same relation is applied to C1 and C2. Therefore, the material, the thickness, and the like of the gate insulating layer are desirably set as appropriate to satisfy the above relation.

In the semiconductor device described in this embodiment, the floating gate portion FG has an effect similar to that of a floating gate of a floating gate transistor of a flash memory or the like, but the floating gate portion FG of this embodiment has a feature which is essentially different from that of the floating gate of the flash memory or the like. In the case of a flash memory, since a voltage applied to a control gate is high, it is necessary to keep a proper distance between cells in order to prevent the potential from affecting a floating gate of the adjacent cell. This is one of inhibiting factors for higher integration of the semiconductor device. The factor is attributed to a basic principle of a flash memory, in which a tunneling current flows by applying a high electric field.

In contrast, the semiconductor device according to this embodiment is operated by switching of the transistor including an oxide semiconductor and does not use the principle of charge injection by tunneling current. That is, a high electric field for charge injection is not necessary unlike a flash memory. Accordingly, it is not necessary to consider an influence of a high electric field from a control gate on the adjacent cell, which facilitates higher integration.

In addition, it is also advantageous that a high electric field is unnecessary and a large peripheral circuit (such as a booster circuit) is unnecessary as compared to a flash memory. For example, the highest voltage applied to the memory cell according to this embodiment (the difference between the highest potential and the lowest potential which are applied to terminals of the memory cell at the same time) can be less than or equal to 5 V, preferably less than or equal to 3 V, in each memory cell in the case where data of two levels (one bit) is written.

In the case where the dielectric constant ∈r1 of the insulating layer included in the capacitor 164 is different from the dielectric constant ∈r2 of the insulating layer included in the transistor 160, it is easy to satisfy C1≥C2 (C1 is greater than or equal to C2) while 2·S2≥S1 (2·S2 is greater than or equal to S1), desirably, S2≥S1 (S2 is greater than or equal to S1) is satisfied where S1 is the area of the insulating layer included in the capacitor 164 and S2 is the area of the insulating layer forming a gate capacitor of the transistor 160. That is, it is easy to satisfy C1≥C2 while the area of the insulating layer included in the capacitor 164 is small. Specifically, for example, a film including a high-k material such as hafnium oxide or a stack of a film including a high-k material such as hafnium oxide and a film including an oxide semiconductor is used for the insulating layer included in the capacitor 164 so that ∈r1 can be 10 or more, preferably 15 or more; silicon oxide is used for the insulating layer forming the gate capacitor so that ∈r2 can be 3≤∈r2≤4 (∈r2 is greater than or equal to 3 and less than or equal to 4).

Combination of such structures enables higher integration of the semiconductor device according to the invention disclosed herein.

Note that in addition to the increase in the degree of integration, a multilevel technique can be employed in order to increase the storage capacity of the semiconductor device. For example, three or more levels of data are written to one memory cell, whereby the storage capacity can be increased as compared to the case where two levels of data are written. The multilevel technique can be achieved by, for example, giving charge Q, which is different from charge $Q_L$ for supplying a low potential and charge $Q_H$ for supplying a high potential, to the gate electrode of the first transistor. In this case, enough storage capacity can be ensured even when a circuit configuration in which $F^2$ is not sufficiently small is employed.

Note that an n-channel transistor in which electrons are majority carriers is used in the above description; it is needless to say that a p-channel transistor in which holes are majority carriers can be used instead of the n-channel transistor.

As described above, the semiconductor device according to this embodiment is suitable for increasing the degree of integration. Note that according to an embodiment of the invention disclosed herein, a wiring is shared and the contact area is reduced; thus, a semiconductor device in which the degree of integration is further increased can be provided.

The structures, methods, and the like described in this embodiment can be combined as appropriate with any of the structures, methods, and the like described in other embodiments.

Embodiment 4

In this embodiment, an application example of the semiconductor device described in the above embodiment will be described. Specifically, an example of a semiconductor device in which the semiconductor devices described in the above embodiment are arranged in matrix will be described.

Figure 9:
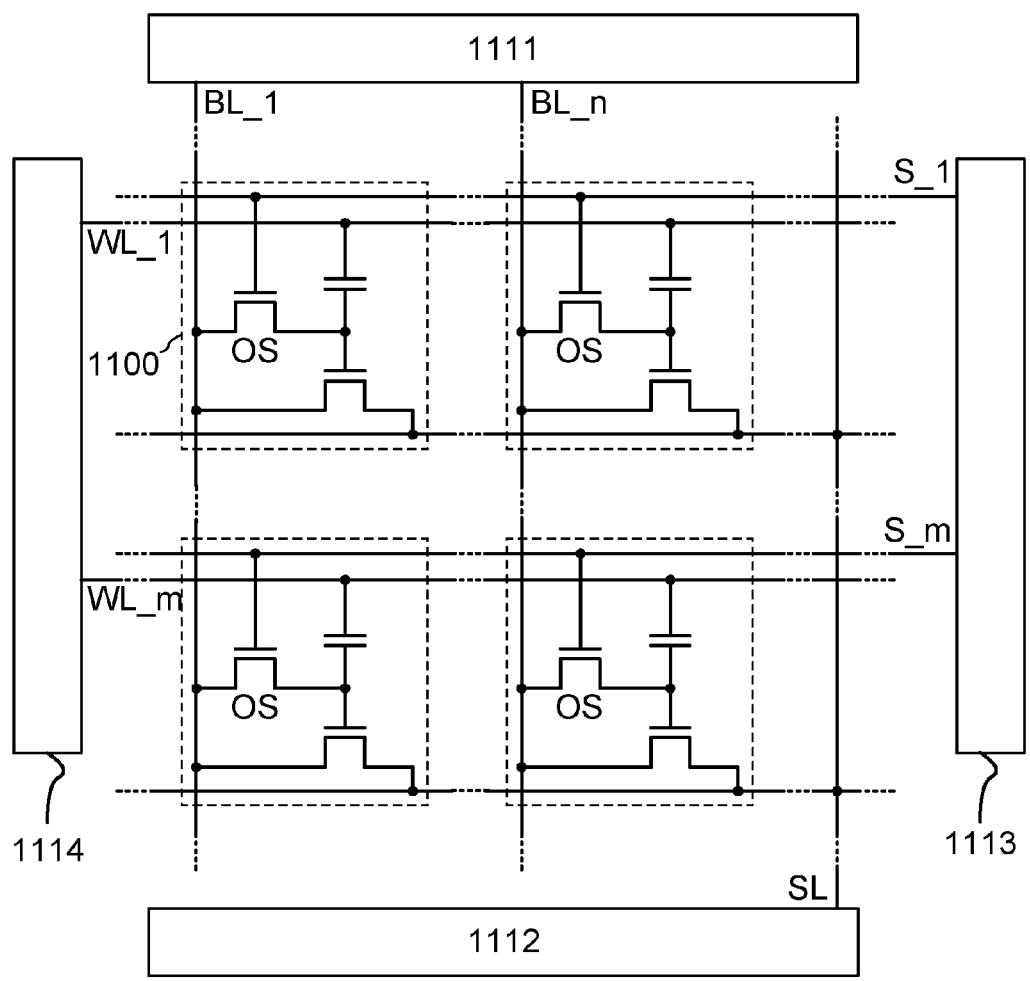
FIG. 9 is a circuit diagram of a semiconductor device.

FIG. 9 is an example of a circuit diagram of a semiconductor device having a storage capacity of (m×n) bits.

The semiconductor device according to an embodiment of the present invention includes a memory cell array which includes m (m is an integer of greater than or equal to 2) signal lines S, m word lines WL, n (n is an integer of greater than or equal to 2) bit lines BL, k (k is a natural number of less than n) source lines SL, and memory cells 1100 arranged in matrix of m (rows) (in a vertical direction)×n (columns) (in a horizontal direction); and peripheral circuits such as a first driver circuit 1111, a second driver circuit 1112, a third driver circuit 1113, and a fourth driver circuit 1114. Here, the structure described in the above embodiment (the structure in FIG. 8A) is applied to the memory cell 1100.

Each of the memory cells 1100 includes a first transistor, a second transistor, and a capacitor. In each of the memory cells 1100, a gate electrode of the first transistor, a source electrode (or a drain electrode) of the second transistor, and one electrode of the capacitor are electrically connected to each other, and the source line SL and a source electrode of the first transistor are electrically connected to each other. Furthermore, the bit line BL, the other of the source electrode and the drain electrode of the second transistor, and a drain electrode of the first transistor are electrically connected to each other. The word line WL and the other electrode of the capacitor are electrically connected to each other. The signal line S and a gate electrode of the second transistor are electrically connected to each other. In other words, the source line SL corresponds to the first wiring (the 1st line) in the structure illustrated in FIG. 8A, the bit line BL corresponds to the second wiring (the 2nd line) and the third wiring (the 3rd line), the signal line S corresponds to the fourth wiring (the 4th line), and the word line WL corresponds to the fifth wiring (the 5th line).

In the memory cell array illustrated in FIG. 9, the bit lines BL, the source lines SL, the word lines WL, and the signal lines S form the matrix arrangement. To one of the bit lines BL, m memory cells 1100 arranged in the same column are connected. In addition, n memory cells 1100 arranged in the same row are connected to one of the word lines WL and one of the signal lines S. Further, the number of the source lines SL is smaller than that of the bit lines BL; therefore, a plurality of memory cells including at least the memory cells 1100 connected to different bit lines BL need to be connected to one of the source lines. In other words, j (j is an integer of greater than or equal to (m+1) and less than or equal to (m×n)) memory cells 1100 are connected to one of the source lines SL. Note that source regions of the first transistors included in the plurality of memory cells 1100 connected to one of the source line SL are formed in the same layer. Note that it is preferable that the source line SL be arranged in the proportion of one to a plurality of bit lines BL (i.e., (n/k) is an integer). In that case, if an equal number of the memory cells 1100 is connected to each source line SL, (m×n/k) memory cells 1100 are connected to one of the source lines SL.

As in the memory cell array illustrated in FIG. 9, one of the source lines SL which connects one of the memory cells 1100 to another memory cell is connected to a plurality of memory cells 1100 including at least the memory cells connected to different bit lines BL to make the number of source lines SL smaller than that of bit lines BL, whereby the number of source lines can be made sufficiently small; thus, the degree of integration of the semiconductor device can be increased.

The bit lines BL are electrically connected to the first driver circuit 1111. The source lines SL are electrically connected to the second driver circuit 1112. The signal lines S are electrically connected to the third driver circuit 1113. The word lines WL are electrically connected to the fourth driver circuit 1114. Note that here, the first driver circuit 1111, the second driver circuit 1112, the third driver circuit 1113, and the fourth driver circuit 1114 are separately provided; however, the invention disclosed herein is not limited to this. A driver circuit having any one or more of the functions may alternatively be used.

Next, writing operation and reading operation will be described. FIG. 10 is an example of a timing chart of writing operation and reading operation of the semiconductor device illustrated in FIG. 9.

Although operation of a semiconductor device including a memory cell array of two rows and two columns will be described for simplification here, the invention disclosed herein is not limited to this.

Writing data to the memory cell 1100 (1,1) and the memory cell 1100 (1,2) which are in the first row and reading data from the memory cell 1100 (1,1) and the memory cell 1100 (1,2) which are in the first row will be described. Note that in the following description, it is assumed that data to be written to the memory cell (1,1) is "1" and data to be written to the memory cell (1,2) is "0".

First, the writing will be described. A potential V1 is supplied to a signal line S(1) of the first row, so that the second transistors of the first row are turned on. Further, a potential of 0 V is supplied to a signal line S(2) of the second row, so that the second transistors of the second row are turned off.

Further, a potential V2 is supplied to a bit line BL(1) of the first column and a potential of 0 V is supplied to a bit line BL(2) of the second column.

As a result, the potential V2 and the potential of 0 V are supplied to a floating gate portion FG of the memory cell (1,1) and a floating gate portion FG of the memory cell (1,2), respectively. Here, the potential V2 is higher than the threshold voltage of the first transistor. Then, the potential of the signal line S(1) of the first row is set to 0 V, so that the second transistors of the first row are turned off. Thus, the writing is completed. It is preferable that the potential V2 be substantially equal to the potential V1 or less than or equal to the potential V1.

Note that a word line WL(1) of the first row and a word line WL(2) of the second row are at the potential of 0 V during the writing operation. At the end of the writing, before the potential of the bit line BL(1) of the first column is changed, the potential of the signal line S(1) of the first row is set to 0 V. After writing, the threshold voltage of the memory cell is Vw0 in the case of data "0" and Vw1 in the case of data "1". Here, the threshold voltage of the memory cell means voltage of a terminal connected to the word line WL, which changes resistance between the source electrode and the drain electrode of the first transistor. Note that Vw0>0>Vw1 is satisfied.

Then, the reading will be described. Here, the bit line BL is electrically connected to a reading circuit illustrated in FIG. 11.

First, the potential of 0 V and a potential VL are supplied to the word line WL(1) of the first row and the word line WL(2) of the second row, respectively. The potential VL is lower than the threshold voltage Vw1. When the word line WL(1) is at the potential of 0 V, in the first row, the first transistor of the memory cell in which data "0" is held is turned off, and the first transistor of the memory cell in which data "1" is held is turned on. When the word line WL(2) is at the potential VL, in the second row, the first transistors of the memory cells in which either data "0" or data "1" is held are off.

As a result, the first transistor of the memory cell (1,1) between the bit line BL(1) and the source line SL is turned on, thereby having low resistance, and the first transistor of the memory cell (1,2) between the bit line BL(2) and the source line SL(1) is turned off, thereby having high resistance. The reading circuit connected to the bit line BL(1) and the bit line BL(2) can read data on the basis of a difference in resistance between the bit lines.

Note that during reading operation, the potential of 0 V and the potential VL are supplied to the signal line S(1) and the signal line S(2), respectively, so that all the second transistors are turned off. The potential of the floating gate portion FG of the first row is 0 V or V2; thus, the potential of the signal line S(1) is set to the potential of 0 V, whereby all the second transistors can be turned off. On the other hand, the potential of the floating gate portion FG of the second row is lower than the potential at the time immediately after data writing if the potential VL is supplied to the word line WL(2). Therefore, in order to prevent the second transistor from being turned on, the potential of the signal line S(2) is set to low (the potential VL) similarly to the potential of the word line WL(2). That is, the potentials of the signal line S and the word line WL in the row where data is not read are set to the same low potential (the potential VL). Thus, all the second transistors can be turned off.

Figure 11:
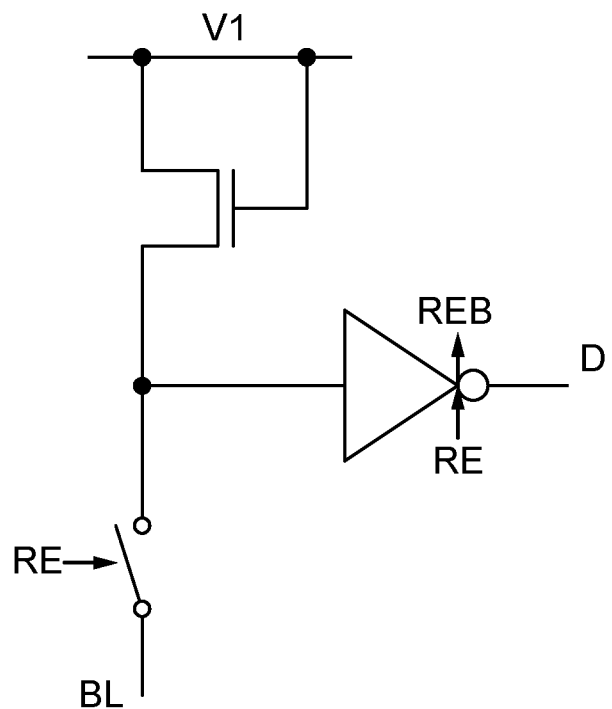
FIG. 11 is a circuit diagram of a semiconductor device.

Next, an output potential in the case where the circuit in FIG. 11 is used as a reading circuit will be described. In the reading circuit illustrated in FIG. 11, the bit line BL is connected to a clocked inverter and a transistor which is diode-connected to a wiring to which the potential V1 is supplied through a switching element controlled by a read enable signal (RE signal). Further, a fixed potential (e.g., 0 V) is supplied to the source line SL. Since the resistance between the bit line BL(1) and the source line SL is low, a low potential is input to the clocked inverter and an output D(1) is High. Since the resistance between the bit line BL(2) and the source line SL is high, a high potential is supplied to the clocked inverter and an output D(2) is Low.

The operation potentials can be set to V1=2 V, V2=1.5 V, VH=2V, and VL=−2 V, for example.

Next, writing operation which is different from the above-described writing operation will be described. Data to be written is the same as that in the above-described writing operation. FIG. 12 is an example of a timing chart of the writing operation and reading operation.

In the writing based on the timing chart of FIG. 10 (i.e., writing to the first row), the potential of the word line WL(2) at the time of writing is set to the potential of 0 V; thus, for example, in the case where data which has been written to the memory cell (2,1) or the memory cell (2,2) is data "1", stationary current flows between the bit line BL(1) and the bit line BL(2). That is because at the time of the writing to the first row, the first transistors in the memory cells of the second row are turned on, whereby the bit line BL(1) and the bit line BL(2) are connected at low resistance through the source line. In the writing operation illustrated in FIG. 12, such stationary current is prevented from being generated.

The potential V1 is supplied to the signal line S(1) of the first row, so that the second transistors of the first row are turned on. Further, the potential of 0 V is supplied to the signal line S(2) of the second row, so that the second transistors of the second row are turned off.

Further, the potential V2 is supplied to the bit line BL(1) of the first column and the potential of 0 V is supplied to the bit line BL(2) of the second column.

As a result, the potential V2 and the potential of 0 V are supplied to the floating gate portion FG of the memory cell (1,1) and the floating gate portion FG of the memory cell (1,2), respectively. Here, the potential V2 is higher than the threshold voltage of the first transistor. Then, the potential of the signal line S(1) of the first row is set to 0 V, so that the second transistors of the first row are turned off. Thus, the writing is completed.

Note that the word line WL(1) of the first row is at the potential of 0 V and the word line WL(2) of the second row is at the potential VL during the writing operation. When the word line WL(2) of the second row is at the potential VL, in the second row, the first transistors of the memory cells in which either data "0" or data "1" is held are in an off state. Further, the potential V2 is supplied to the source line SL during the writing operation. In the case where all the written data are data "0", the potential of 0 V may be supplied to the source line.

At the end of the writing, before the potential of the bit line BL(1) of the first column is changed, the potential of the signal line S(1) of the first row is set to 0 V. After writing, the threshold voltage of the memory cell is Vw0 in the case of data "0" and Vw1 in the case of data "1". Note that Vw0>0>Vw1 is satisfied here.

In the writing operation, the first transistors in the memory cells of the row where data is not to be written (in this case, the second row) are off. Thus, only the memory cells of the row where data is to be written have a problem of stationary current between the bit line and the source line. In the case where data "0" is written to the memory cell of the row where data is to be written, the first transistor in the memory cell is off; thus, a problem of stationary current does not occur. On the other hand, in the case where data "1" is written to the memory cell of the row where data is to be written, the first transistor in the memory cell is on; thus, stationary current occurs if there is a potential difference between the source line SL and the bit line BL (in this case, the bit line BL(1)). Thus, the potential of the source line SL is made to be equal to the potential V2 of the bit line BL(1), whereby stationary current between the bit line and the source line can be prevented.

As described above, generation of stationary current at the time of writing can be prevented by the writing operation. In other words, power consumed at the time of the writing operation can be sufficiently reduced.

Note that the reading operation is performed in a manner similar to that of the above-described reading operation.

A semiconductor device including an oxide semiconductor, whose off-state current is extremely small, is used as the semiconductor device illustrated in FIG. 9, whereby stored data can be held for an extremely long time. In other words, power consumption can be adequately reduced because refresh operation becomes unnecessary or the frequency of refresh operation can be extremely low. Moreover, stored data can be held for a long time even when power is not supplied.

Further, in the semiconductor device illustrated in FIG. 9, high voltage is not needed for writing data and there is no problem of deterioration of elements. Therefore, the semiconductor device illustrated in FIG. 9 does not have a limitation on the number of times of rewritings, which has been a problem in a conventional non-volatile memory; thus, the reliability thereof is drastically improved. Furthermore, since data is written by turning on or off the transistor, high-speed operation can be easily realized. In addition, there is no need of operation for erasing data.

Since a transistor including a material other than an oxide semiconductor can operate at sufficiently high speed, a semiconductor device can perform operation (e.g., reading data) at sufficiently high speed in combination with a transistor including an oxide semiconductor. Further, a transistor including a material other than an oxide semiconductor can favorably realize a variety of circuits (such as a logic circuit or a driver circuit) which are required to operate at high speed.

A semiconductor device with a novel feature can be realized by including both the transistor including a material other than an oxide semiconductor and the transistor including an oxide semiconductor.

Furthermore, in the semiconductor device illustrated in FIG. 9, the number of wirings per memory cell can be reduced. Thus, the area of memory cells can be reduced and storage capacity per unit area of the semiconductor device can be increased.

The structures, methods, and the like described in this embodiment can be combined as appropriate with any of the structures, methods, and the like described in other embodiments.

Embodiment 5

In this embodiment, the cases where the semiconductor device described in any of the above embodiments is applied to an electronic device will be described with reference to FIGS. 13A to 13F. In this embodiment, examples of the electronic device to which the above semiconductor device is applied include a computer, a mobile phone (also referred to as a mobile telephone or a mobile phone device), a personal digital assistant (including a portable game machine, an audio reproducing device, and the like), a camera such as a digital camera or a digital video camera, an electronic paper, and a television device (also referred to as a television or a television receiver).

Figure 13A:
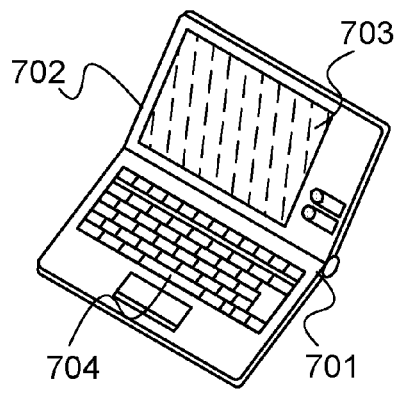
FIGS. 13A to 13F are diagrams each illustrating an electronic device including a semiconductor device.

FIG. 13A illustrates a laptop computer including a housing 701, a housing 702, a display portion 703, a keyboard 704, and the like. A memory circuit is provided inside the housings 701 and 702, and the memory circuit includes the semiconductor device described in any of the above embodiments. Therefore, a laptop personal computer in which writing and reading of data are performed at high speed, data is stored for a long time, and power consumption is sufficiently reduced can be realized.

Figure 13D:
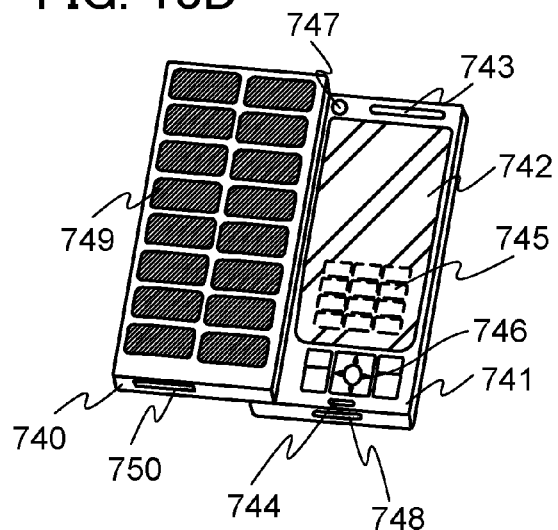
Figure 13B:
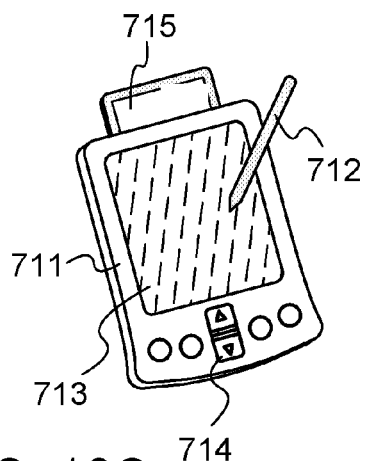

FIG. 13B is a portable information terminal (personal digital assistant (PDA)). A main body 711 is provided with a display portion 713, an external interface 715, operation buttons 714, and the like. Further, a stylus 712 and the like for operation of the portable information terminal are provided. A memory circuit is provided inside the main body 711, and the memory circuit includes the semiconductor device described in any of the above embodiments. Therefore, a portable information terminal in which writing and reading of data are performed at high speed, data is stored for a long time, and power consumption is sufficiently reduced can be realized.

Figure 13E:
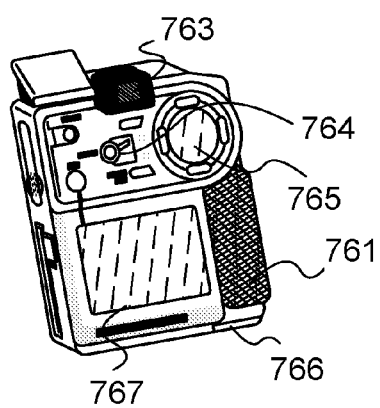
Figure 13C:
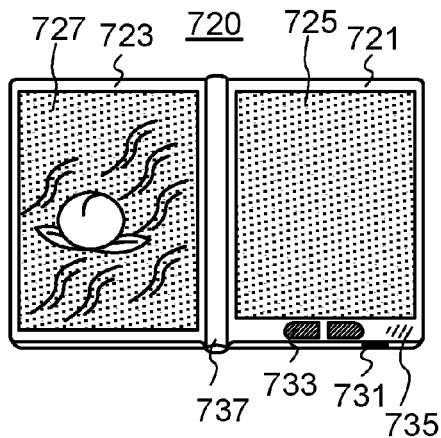

FIG. 13C illustrates an e-book reader 720 mounted with electronic paper, which includes two housings, a housing 721 and a housing 723. The housing 721 and the housing 723 are provided with a display portion 725 and a display portion 727, respectively. The housings 721 and 723 are connected by a hinge portion 737 and can be opened and closed with the hinge portion 737. The housing 721 is provided with a power supply switch 731, an operation key 733, a speaker 735, and the like. A memory circuit is provided inside at least one of the housings 721 and 723, and the memory circuit includes the semiconductor device described in any of the above embodiments. Therefore, an e-book reader in which writing and reading of data are performed at high speed, data is stored for a long time, and power consumption is sufficiently reduced can be realized.

FIG. 13D is a mobile phone including two housings, a housing 740 and a housing 741. Further, the housing 740 and the housing 741 in a state where they are developed as illustrated in FIG. 13D can shift by sliding so that one is lapped over the other; therefore, the size of the mobile phone can be reduced, which makes the mobile phone suitable for being carried. The housing 741 includes a display panel 742, a speaker 743, a microphone 744, an operation key 745, a pointing device 746, a camera lens 747, an external connection terminal 748, and the like. The housing 740 includes a solar cell 749 for charging the cellular phone, an external memory slot 750, and the like. In addition, an antenna is incorporated in the housing 741. A memory cell is provided inside at least one of the housings 740 and 741, and the memory circuit includes the semiconductor device described in any of the above embodiments. Therefore, a mobile phone in which writing and reading of data are performed at high speed, data is stored for a long time, and power consumption is sufficiently reduced can be realized.

FIG. 13E is a digital camera including a main body 761, a display portion 767, an eyepiece 763, an operation switch 764, a display portion 765, a battery 766, and the like. A memory circuit is provided inside the main body 761, and the memory circuit includes the semiconductor device described in any of the above embodiments. Therefore, a digital camera in which writing and reading of data are performed at high speed, data is stored for a long time, and power consumption is sufficiently reduced can be realized.

Figure 13F:
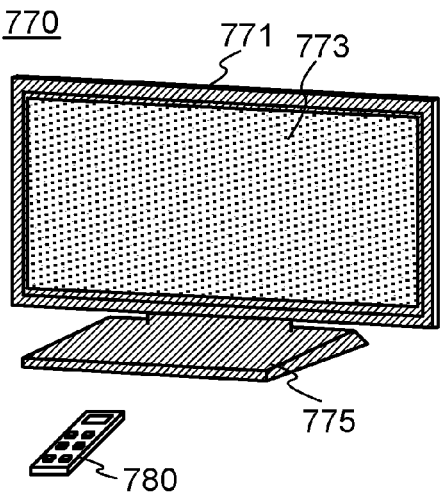

FIG. 13F is a television device 770 including a housing 771, a display portion 773, a stand 775, and the like. The television device 770 can be operated with an operation switch of the housing 771 or a remote controller 780. The semiconductor device described in any of the above embodiments is mounted on the housing 771 and the remote controller 780. Therefore, a television set in which writing and reading of data are performed at high speed, data is stored for a long time, and power consumption is sufficiently reduced can be realized.

As described above, the electronic devices described in this embodiment each include the semiconductor device according to any of the above embodiments. Therefore, electronic devices with low power consumption can be realized.

This application is based on Japanese Patent Application serial no. 2010-129278 filed with Japan Patent Office on Jun. 4, 2010, the entire contents of which are hereby incorporated by reference.

EXPLANATION OF REFERENCE

100: base substrate, 102: insulating layer, 110: single crystal semiconductor substrate, 112: insulating layer, 114: embrittled region, 116: single crystal semiconductor layer, 118: single crystal semiconductor layer, 120: semiconductor layer, 122: insulating layer, 122a: gate insulating layer, 124: mask, 126: impurity region, 128a: gate electrode, 128b: conductive layer, 130: impurity region, 132: impurity region, 134: channel formation region, 136: insulating layer, 138: insulating layer, 140: insulating layer, 142a: source electrode or drain electrode, 142b: source electrode or drain electrode, 144: oxide semiconductor layer, 146: gate insulating layer, 148a: gate electrode, 148b: conductive layer, 150: insulating layer, 154: wiring, 156: insulating layer, 160: transistor, 162: transistor, 164: capacitor, 166: transistor, 701: housing, 702: housing, 703: display portion, 704: keyboard, 711: main body, 712: stylus, 713: display portion, 714: operation button, 715: external interface, 720: e-book reader, 721: housing, 723: housing, 725: display portion, 727: display portion, 731: power supply switch, 733: operation key, 735: speaker, 737: hinge portion, 740: housing, 741: housing, 742: display panel, 743: speaker, 744: microphone, 745: operation key, 746: pointing device, 747: camera lens, 748: external connection terminal, 749: solar cell, 750: external memory slot, 761: main body, 763: eyepiece, 764: operation switch, 765: display portion, 766: battery, 767: display portion, 770: television device, 771: housing, 773: display portion, 775: stand, 780: remote controller, 1100: memory cell, 1111: first driver circuit, 1112: second driver circuit, 1113: third driver circuit, and 1114: fourth driver circuit.

The invention claimed is:

1. A semiconductor device comprising:
a first memory cell comprising a first transistor and a second transistor, the first transistor and the second transistor overlapping with each other at least partly; and
a second memory cell comprising a third transistor and a fourth transistor, the third transistor and the fourth transistor overlapping with each other at least partly,
wherein each of the first transistor and the third transistor comprises:
a first source region;
a first drain region;
a first channel formation region between the first source region and the first drain region, the first channel formation region comprising a first semiconductor material; and
a first gate electrode over the first channel formation region with a first gate insulating layer interposed between the first gate electrode and the first channel formation region,
wherein each of the second transistor and the fourth transistor comprises:
a second channel formation region comprising a second semiconductor material different from the first semiconductor material;
a source electrode electrically connected to the second channel formation region;
a drain electrode electrically connected to the second channel formation region; and
a second gate electrode over the second channel formation region with a second gate insulating layer interposed between the second gate electrode and the second channel formation region,
wherein one of the first source region and the first drain region is electrically connected to one of the source electrode and the drain electrode via a first conductive layer,
wherein the first conductive layer and the first gate electrode are patterned portions of a same layer, and
wherein the one of source electrode and the drain electrode of the second transistor is electrically connected to the one of source electrode and the drain electrode of the fourth transistor via a wiring.

2. The semiconductor device according to claim 1, wherein the first gate electrode is electrically connected to the other of the source electrode and the drain electrode.

3. The semiconductor device according to claim 1, further comprising a second conductive layer overlapping with the other of the source electrode and the drain electrode, wherein a capacitor comprises the other of the source electrode and the drain electrode, the second gate insulating layer, and the second conductive layer.

4. The semiconductor device according to claim 1, wherein the second channel formation region comprises an oxide semiconductor.

5. A semiconductor device comprising:
a first memory cell comprising a first transistor and a second transistor over the first transistor; and
a second memory cell comprising a third transistor and a fourth transistor over the third transistor,
wherein each of the first transistor and the third transistor comprises:
- a first channel formation region on an insulating surface;
- an impurity region on the insulating surface; and
- a first gate electrode over the first channel formation region with a first gate insulating layer interposed between the first gate electrode and the first channel formation region, wherein each of the second transistor and the fourth transistor comprises:
- an oxide semiconductor layer comprising a second channel formation region; and
- a second gate electrode over the second channel formation region with a second gate insulating layer interposed between the second gate electrode and the second channel formation region, wherein each of the first memory cell and the second memory cell further comprises:
- a first electrode electrically connected to the oxide semiconductor layer;
- a second electrode electrically connected to the oxide semiconductor layer;
- a first conductive layer electrically connected to the impurity region; and
- a second conductive layer over the second gate insulating layer, the second conductive layer overlapping with the first electrode, wherein the first electrode is in contact with a top face of the first gate electrode,
wherein the second electrode is in contact with a top face of the first conductive layer, and
wherein the second electrode of the first memory cell is electrically connected to the second electrode of the second memory cell via a wiring.

6. The semiconductor device according to claim 5, wherein the first conductive layer and the first gate electrode are patterned portions of a same layer.

7. The semiconductor device according to claim 5, wherein a capacitor comprises the first electrode, the second gate insulating layer and the second conductive layer.

8. A semiconductor device comprising:
- a first channel formation region on an insulating surface;
- an impurity region on the insulating surface;
- a first insulating layer over the first channel formation region and the impurity region;
- a first gate electrode over the first insulating layer, the first gate electrode overlapping with the first channel formation region;
- a first electrode over the first gate electrode, the first electrode being in contact with the first gate electrode;
- an oxide semiconductor layer in contact with the first electrode, the oxide semiconductor layer comprising a second channel formation region;
- a second electrode in contact with the oxide semiconductor layer;
- a first conductive layer below the second electrode, the first conductive layer being in contact with a bottom face of the second electrode;
- a second insulating layer over the oxide semiconductor layer, the first electrode and the second electrode;
- a second gate electrode over the second insulating layer, the second gate electrode overlapping with the second channel formation region;
- a second conductive layer over the second insulating layer, the second conductive layer overlapping with the first electrode;
- a third insulating layer over the second gate electrode and the second conductive layer; and
- a wiring over the third insulating layer, the wiring is electrically connected to the second electrode.

9. The semiconductor device according to claim 8, wherein the first conductive layer and the first gate electrode are patterned portions of a same layer.

10. The semiconductor device according to claim 8, wherein a capacitor comprises the first electrode, the second insulating layer and the second conductive layer.

* * * * *